(12) United States Patent
Teig

(10) Patent No.: US 8,201,124 B1
(45) Date of Patent: Jun. 12, 2012

(54) SYSTEM IN PACKAGE AND METHOD OF CREATING SYSTEM IN PACKAGE

(75) Inventor: Steven Teig, Menlo Park, CA (US)

(73) Assignee: Tabula, Inc., Santa Clara, CA (US)

(*) Notice: Subject to any disclaimer, the term of this patent is extended or adjusted under 35 U.S.C. 154(b) by 19 days.

(21) Appl. No.: 12/198,878

(22) Filed: Aug. 26, 2008

Related U.S. Application Data

(63) Continuation of application No. 11/269,506, filed on Nov. 7, 2005, which is a continuation-in-part of application No. 11/081,820, filed on Mar. 15, 2005, now Pat. No. 7,530,044.

(51) Int. Cl.
*G06F 17/50* (2006.01)

(52) U.S. Cl. ........................................ 716/116

(58) Field of Classification Search .............. 716/1, 8, 716/116
See application file for complete search history.

(56) References Cited

U.S. PATENT DOCUMENTS

| | | |
|---|---|---|
| 5,426,378 A | 6/1995 | Ong |
| 5,434,453 A | 7/1995 | Yamamoto et al. |
| 5,512,765 A | 4/1996 | Gaverick |
| 5,521,835 A | 5/1996 | Trimberger |
| 5,530,292 A | 6/1996 | Waki et al. |
| 5,596,743 A | 1/1997 | Bhat et al. |
| 5,600,263 A | 2/1997 | Trimberger et al. |
| 5,610,442 A | 3/1997 | Schneider et al. |
| 5,610,829 A | 3/1997 | Trimberger |
| 5,629,637 A | 5/1997 | Trimberger et al. |
| 5,646,545 A | 7/1997 | Trimberger et al. |
| 5,701,441 A | 12/1997 | Trimberger |
| 5,721,498 A | 2/1998 | Mason et al. |
| 5,761,483 A | 6/1998 | Trimberger |
| 5,815,372 A | 9/1998 | Gallas |
| 5,825,662 A | 10/1998 | Trimberger |
| 5,869,896 A | 2/1999 | Baker et al. |
| 5,920,712 A | 7/1999 | Kuijsten |
| 5,944,813 A | 8/1999 | Trimberger |
| 5,952,725 A | 9/1999 | Ball |
| 5,973,340 A | 10/1999 | Mohsen |
| 6,015,722 A | 1/2000 | Banks et al. |
| 6,018,559 A | 1/2000 | Azegami et al. |
| 6,084,429 A | 7/2000 | Trimberger |
| 6,100,594 A | 8/2000 | Fukui et al. |
| 6,137,164 A | 10/2000 | Yew et al. |
| 6,480,954 B2 | 11/2002 | Trimberger et al. |
| 6,515,505 B1 | 2/2003 | Rees |
| 6,601,227 B1 | 7/2003 | Trimberger |

(Continued)

FOREIGN PATENT DOCUMENTS

JP    4-162767    6/1992

(Continued)

OTHER PUBLICATIONS

U.S. Appl. No. 11/269,506, filed Nov. 7, 2005, Schmit, Herman, et al.

(Continued)

*Primary Examiner* — Suchin Parihar
(74) *Attorney, Agent, or Firm* — Adeli & Tollen LLP

(57) ABSTRACT

Some embodiments of the invention provide a system that includes a first defect tolerant configurable integrated circuit and a second IC communicatively coupled to the defect tolerant configurable first IC.

23 Claims, 25 Drawing Sheets

U.S. PATENT DOCUMENTS

| | | |
|---|---|---|
| 6,633,182 B2 | 10/2003 | Pileggi et al. |
| 6,650,142 B1 | 11/2003 | Agrawal et al. |
| 6,686,223 B2 | 2/2004 | Uchida |
| 6,709,890 B2 | 3/2004 | Ida et al. |
| 6,737,755 B1 | 5/2004 | McLellan et al. |
| 6,744,126 B1 | 6/2004 | Chiang |
| 6,781,226 B2 | 8/2004 | Huppenthal et al. |
| 6,829,756 B1 | 12/2004 | Trimberger |
| 6,906,407 B2 | 6/2005 | Byers et al. |
| 6,964,029 B2 | 11/2005 | Poznanovic et al. |
| 6,969,898 B1 | 11/2005 | Exposito et al. |
| 6,989,285 B2 | 1/2006 | Ball |
| 6,991,947 B1 | 1/2006 | Gheewala |
| 7,009,303 B2 | 3/2006 | Kuroda et al. |
| 7,030,651 B2 | 4/2006 | Madurawe |
| 7,062,744 B2 | 6/2006 | Osann, Jr. |
| 7,082,591 B2 | 7/2006 | Carlson |
| 7,091,598 B2 | 8/2006 | Fujita et al. |
| 7,126,214 B2 | 10/2006 | Huppenthal et al. |
| 7,138,827 B1 | 11/2006 | Trimberger |
| 7,143,329 B1 | 11/2006 | Trimberger et al. |
| 7,200,235 B1 | 4/2007 | Trimberger |
| 7,203,842 B2 * | 4/2007 | Kean .............................. 713/189 |
| 7,212,448 B1 | 5/2007 | Trimberger |
| 7,219,421 B2 | 5/2007 | Vrtis et al. |
| 7,224,182 B1 | 5/2007 | Hutchings et al. |
| 7,259,587 B1 | 8/2007 | Schmit |
| 7,286,976 B2 | 10/2007 | Diehl et al. |
| 7,301,242 B2 | 11/2007 | Teig |
| 7,310,757 B2 | 12/2007 | Ngo et al. |
| 7,328,384 B1 | 2/2008 | Kulkarni et al. |
| 7,424,655 B1 | 9/2008 | Trimberger |
| 7,530,044 B2 | 5/2009 | Teig |
| 7,532,032 B2 | 5/2009 | Schmit |
| 7,936,074 B2 | 5/2011 | Teig |
| 2002/0010853 A1 | 1/2002 | Trimberger et al. |
| 2002/0066956 A1* | 6/2002 | Taguchi ........................ 257/734 |
| 2002/0157071 A1* | 10/2002 | Schiefele et al. ................. 716/6 |
| 2004/0040005 A1* | 2/2004 | Carison .............................. 716/8 |
| 2004/0061147 A1 | 4/2004 | Fujita et al. |
| 2004/0088666 A1 | 5/2004 | Poznanovic et al. |
| 2004/0105207 A1 | 6/2004 | Spaderna et al. |
| 2004/0130036 A1 | 7/2004 | Owaki et al. |
| 2004/0169285 A1 | 9/2004 | Verma et al. |
| 2004/0221451 A1 | 11/2004 | Chia et al. |
| 2004/0243383 A1 | 12/2004 | Garino et al. |
| 2004/0262774 A1 | 12/2004 | Kang et al. |
| 2005/0017336 A1 | 1/2005 | Kung et al. |
| 2005/0051903 A1 | 3/2005 | Ellsberry et al. |
| 2005/0066294 A1 | 3/2005 | Templeton et al. |
| 2005/0181539 A1 | 8/2005 | Ohie |
| 2005/0189634 A1 | 9/2005 | Wakiyama et al. |
| 2005/0193353 A1 | 9/2005 | Malekkhosravi et al. |
| 2005/0257178 A1 | 11/2005 | Daems et al. |
| 2005/0269687 A1 | 12/2005 | Forcier |
| 2005/0275074 A1 | 12/2005 | Weng et al. |
| 2006/0071701 A1 | 4/2006 | Nickolls |
| 2006/0118927 A1 | 6/2006 | Verma et al. |
| 2006/0195729 A1 | 8/2006 | Huppenthal et al. |
| 2007/0045806 A1 | 3/2007 | Hsuan |
| 2007/0108598 A1 | 5/2007 | Zhong et al. |
| 2007/0143577 A1 | 6/2007 | Smith |
| 2008/0068042 A1 | 3/2008 | Teig |
| 2008/0122484 A1* | 5/2008 | Zhu et al. ........................ 326/38 |
| 2008/0179729 A1 | 7/2008 | Shim, II et al. |
| 2008/0215854 A1 | 9/2008 | Asaad et al. |
| 2008/0220563 A1 | 9/2008 | Karnezos |
| 2008/0258762 A1* | 10/2008 | Koo ................................ 326/38 |
| 2008/0293167 A1 | 11/2008 | Wada et al. |
| 2011/0018582 A1* | 1/2011 | Chandler et al. ................. 326/38 |
| 2011/0049577 A1* | 3/2011 | Or-Bach et al. ............... 257/209 |
| 2011/0060546 A1* | 3/2011 | Miller et al. ................... 702/120 |
| 2011/0241199 A1 | 10/2011 | Teig |

FOREIGN PATENT DOCUMENTS

| | | |
|---|---|---|
| JP | 5-343606 | 12/1993 |
| KR | 2002039010 | 5/2002 |

OTHER PUBLICATIONS

U.S. Appl. No. 11/269,868, filed Nov. 7, 2005, Horel, Timothy.

U.S. Appl. No. 11/271,165, filed Nov. 11, 2005, Horel, Timothy, et al.

Portions of prosecution history of U.S. Appl. No. 11/081,820, mailing date Dec. 1, 2008 Teig, Steven.

Portions of prosecution history of U.S. Appl. No. 11/081,842 mailing date Sep. 17, 2007 Teig, Steven.

Portions of prosecution history of U.S. Appl. No. 11/861,204, mailed date Jul. 12, 2010 Teig, Steven.

Portions of prosecution history of U.S. Appl. No. 11/271,165, mailing date May 17, 2010 Horel, Timothy, et al.

Portions of prosecution history of U.S. Appl. No. 11/269,868, mailing date Jan. 13, 2010, Horel, Timothy.

Portions of prosecution history of U.S. Appl. No. 11/269,506, mailing date May 11, 2010, Schmit, Herman, et al.

Patel, C., et al., "An Architectural Exploration of Via Patterned Gate Arrays," *Proceedings of the 2003 International Symposium on Physical Design*, Apr. 6-9, 2003, pp. 184-189, Monterey, California, USA.

Patel, C., et al., "An Architectural Exploration of Via Patterned Gate Arrays," *Carnegie Mellon University Center for Silicon System Implementation*, NPL Date Unknown.

Taylor, R., et al., "Enabling Energy Efficiency in Via-Patterned Gate Array Devices", *Proceedings of the 41st annual conference on Design automation*, Jun. 7-11, 2004, San Diego, California, USA.

Tong, K.T., et al., "Regular Logic Fabrics for a Via Patterned Gate Array (VPGA)," *Proceedings of the IEEE 2003 Custom Integrated Circuits Conference 2003*, Sep. 21-24, 2003.

Trimberger, S., "Effects of FPGA Architecture on FPGA Routing," *32nd ACM/IEEE Design Automation Conference*, Jun. 1995, ACM.

Updated portions of prosecution history of U.S. Appl. No. 11/861,204, mailing date Dec. 23, 2010, Teig Steven.

Updated portions of prosecution history of U.S. Appl. No. 11/269,506, mailing date Dec. 6, 2010, Schmit, Herman, et al.

Updated portions of Prosecution History of U.S. Appl. No. 11/081,820, Mailed Mar. 2, 2009, Teig, Steven.

Updated portions of Prosecution History of U.S. Appl. No. 11/081,842, Mailed Sep. 26, 2007, Teig, Steven.

Updated portions of Prosecution History of U.S. Appl. No. 11/861,204, Mailed Mar. 30, 2011, Teig, Steven.

Portions of Prosecution History of U.S. Appl. No. 13/087,327, Mailed Jun. 14, 2011, Teig, Steven.

Updated portions of Prosecution History of U.S. Appl. No. 11/271,165, Mailed Aug. 30, 2010, Horel, Timothy et al.

Updated portions of Prosecution History of U.S. Appl. No. 11/269,868, Mailed Jul. 29, 2011, Horel, Timothy.

* cited by examiner

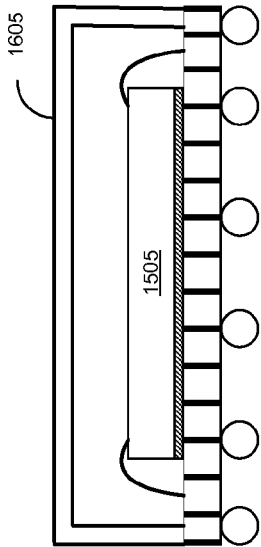
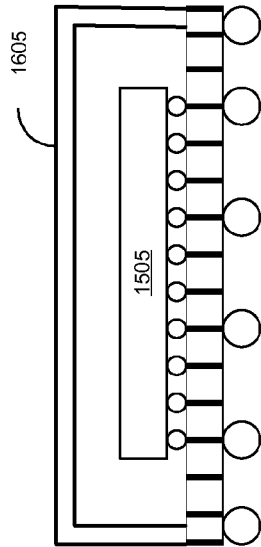
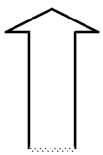
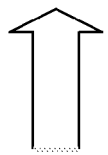
*Figure 16A*
*Figure 16B*

US 8,201,124 B1

SYSTEM IN PACKAGE AND METHOD OF CREATING SYSTEM IN PACKAGE

CLAIM OF BENEFIT TO PRIOR APPLICATIONS

This application is a continuation application of U.S. patent application Ser. No. 11/269,506, filed Nov. 7, 2005, entitled "System with a defect tolerant configurable IC." U.S. patent application Ser. No. 11/269,506 is a continuation in-part application of U.S. patent application Ser. No. 11/081,820, filed Mar. 15, 2005 now U.S. Pat. No. 7,530,044 entitled "Method For Manufacturing a Programmable System in Package," now issued as U.S. Pat. No. 7,530,044.

CROSS REFERENCE TO RELATED APPLICATIONS

This Application is related to the following applications: U.S. patent application Ser. No. 11/271,165, filed Nov. 11, 2005; U.S. patent application Ser. No. 11/269,868, filed Nov. 7, 2005; U.S. patent application Ser. No. 12/011,601, filed Jan. 25, 2008, now issued as U.S. Pat. No. 7,622,951; U.S. patent application Ser. No. 11/271,080, filed Nov. 11, 2005, now issued as U.S. Pat. No. 7,262,633; and U.S. patent application Ser. No. 11/829,300, filed Jul. 27, 2007, now issued as U.S. Pat. No. 7,626,419.

FIELD OF THE INVENTION

The present invention is directed towards a system with a defect tolerant configurable IC.

BACKGROUND OF THE INVENTION

The use of configurable integrated circuits ("IC's") has dramatically increased in recent years. One example of a configurable IC is a field programmable gate array ("FPGA"). An FPGA is a field programmable IC that has an internal array of logic circuits (also called logic blocks) that are connected together through numerous interconnect circuits (also called interconnects) and that are surrounded by input/output blocks. Like some other configurable IC's, the logic circuits and the interconnect circuits of an FPGA are configurable (i.e., they can be configured to perform different functions and operations by receiving different configuration data). One benefit of configurable IC's is that they can be uniformly mass produced and then subsequently configured to perform different operations.

One way of implementing FPGA's with circuits with other functionalities is to use a system on chip ("SoC") approach. A SoC is an IC that includes all of the necessary hardware and electronic circuitry for a complete system. The SoC is typically a small piece of semiconducting material (e.g., silicon) on which several macroblocks are embedded. Some of these macroblocks can include a memory, a microprocessor, digital signal processor, etc. A characteristic of the SoC is that it requires all the macroblocks to be manufactured with one type of fabrication technology. This can be problematic since each macroblock may have a different optimal fabrication technology (e.g., a memory macroblock might be optimally manufactured at 90 nm, while an analog macroblock might be optimally manufactured at 180 nm). As such, in some instances, some of the macroblocks of a SoC might be manufactured sub-optimally. Another drawback of a SoC is that the design process is often extensive, cumbersome and expensive.

The SoC approach is one way of integrating the functionalities of several IC's. Another way of integrating the functionalities of several IC's is to use a System-in-Package ("SiP") approach. The System-in-Package approach houses several IC dies in one package. This approach has several advantages over the SoC approach. For instance, the SiP approach does not require the design and layout of circuitry that implements some of the more common functionalities that are being integrated.

However, the SiP approach does suffer from the known "good-die" problem. It is known that most manufacturing processes do not always produce "good dies". In other words, most manufacturing processes typically produce defective IC's (i.e., IC's that because of a manufacturing defect fail to perform operations for which they are designed). The term "manufacturing yield" is often used to express the percentage of IC's without defects that are produced in a particular manufacturing process. For example, a 95% manufacturing yield means that for every one hundred IC's that are produced, ninety-five IC's will be defect free, while five IC's will have a defect. The good-die problem is particularly troublesome in SiP's as one bad die in a SiP requires several other dies to be discarded.

Therefore, there is a need in the art for a better method of integrating the functionalities of several IC's, including a configurable IC. Ideally, such an approach will not suffer from the known good-die problem.

SUMMARY OF THE INVENTION

Some embodiments of the invention provide a programmable system in package ("PSiP") that includes several integrated circuits ("IC"). The PSiP includes a first IC, which is a vias programmable gate array ('VPGA'). The PSiP also includes a second IC that communicatively couples to the first IC. The PSiP also includes a substrate on top of which the first and second IC's are mounted. In some embodiments, both the first and second IC's are directly mounted on top of the substrate, while in other embodiments, one of the IC's (e.g., the first IC) is mounted on top of the other IC (e.g., the second IC).

In some embodiments, the first and second IC's and the top side of the substrate on which these IC's are mounted are covered in order to form a single package (i.e., to form the PSiP). In some embodiments, the PSiP includes a cap that encapsulates the top side of the substrate to form a housing that contains the first and second ICs. In other embodiments, the top side of the substrate is covered with a covering fill that covers the first and second IC's. In some cases, the covering fill completely covers the first and second IC's, while in other cases it leaves a portion of one or both of the IC's exposed. The first and second IC's are IC dies in some embodiments. In other embodiments, one or both of the IC's are packaged in another chip scale ("CS") package before placement within the PSiP.

Before mounting this CS-packaged IC into the PSiP, the CS packaging is used to test this IC to ensure that it operates properly. In some cases, the size of the CS package is not greater than a particular percentage (e.g., 120%) of the size of the first IC. The CS package has a flip chip structure in some embodiments.

Instead of, or in conjunction with the CS packaging, the first configurable IC of some embodiments is a defect tolerant configurable IC. The operation of this IC can be adjusted to avoid a certain amount of defects in the manufacturing of the IC. In some embodiments, the configurable IC has configurable logic and interconnect circuits. Some embodiments specify multiple different configuration bit streams for configuring the configurable logic and interconnect circuits of the configurable IC. Some embodiments use place and route tools to specify each configuration bit stream. These tools define the configuration of the logic and interconnect circuits in a manner that allows the logic circuits to perform different functions in the design and the interconnect circuits to route input and output signals to and from the logic circuits.

To specify each configuration bit stream, the place and/or route tools of some embodiments assume that a particular set of the configurable logic and/or interconnect circuits will be defective. After the configurable IC has been manufactured, the configurable IC is tested to identify the set of configurable logic and/or interconnect circuits that are defective. If a particular configuration bit stream was previously defined for the identified set of defective circuits (i.e., if the identified set of defective circuits falls within a set of defective circuits on which a particular configuration bit stream was defined), the particular configuration bit stream is used to configure the configurable IC.

As mentioned above, the defect tolerant configurable IC of some embodiments is housed in a PSiP. In other embodiments, however, the defect tolerant configurable IC might be individually packaged in its own package and then incorporated into an electronic system using conventional system integration techniques.

BRIEF DESCRIPTION OF THE DRAWINGS

The novel features of the invention are set forth in the appended claims. However, for purpose of explanation, several embodiments of the invention are set forth in the following figures.

FIG. 16A illustrates a configurable IC encapsulated in a CS package.

FIG. 16B illustrates a configurable IC with a flip chip structure encapsulated in a CS package.

DETAILED DESCRIPTION OF THE INVENTION

Figure 1:
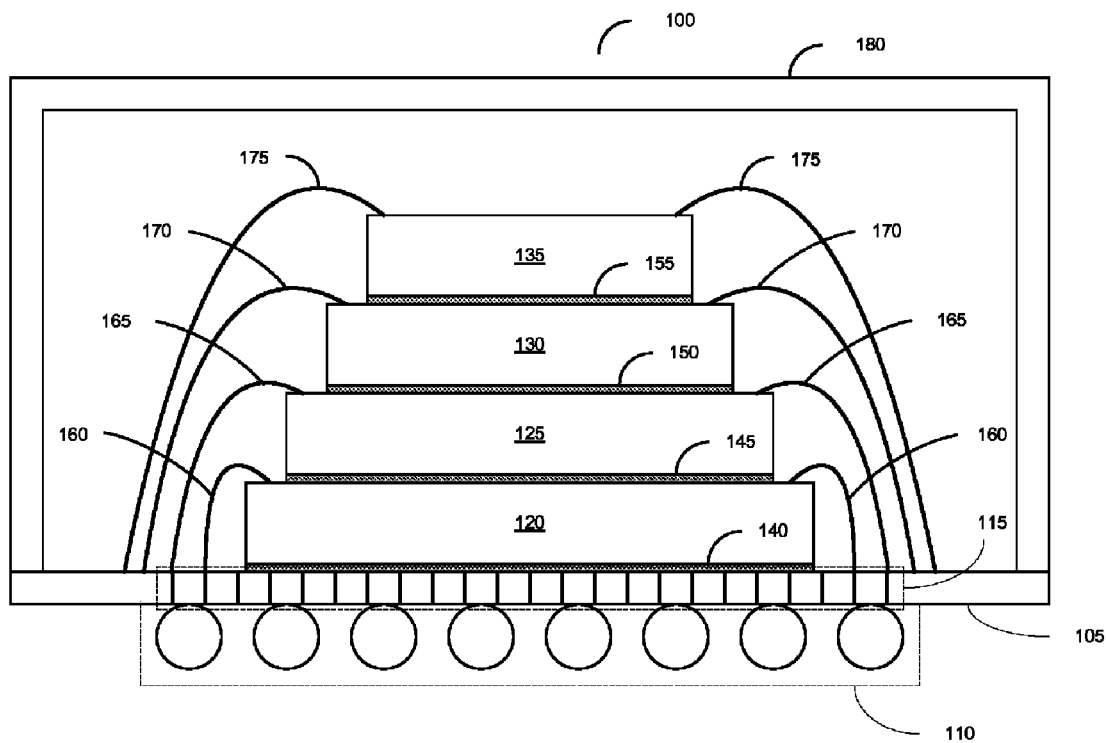
FIG. 1 illustrates a PSiP with IC's that are stacked in a pyramid structure and includes a ball grid array.

In the following description, numerous details are set forth for purpose of explanation. However, one of ordinary skill in the art will realize that the invention may be practiced without the use of these specific details. In other instances well-known structures and devices are shown in block diagram form in order not to obscure the description of the invention with unnecessary detail.

Some embodiments of the invention provide a programmable system in package ("PSiP") that includes several integrated circuits ("IC"). The PSiP includes a first IC, which is a vias programmable gate array ('VPGA'). The PSiP also includes a second IC that communicatively couples to the first IC. The PSiP also includes a substrate on top of which the first and second IC's are mounted. In some embodiments, both the first and second IC's are directly mounted on top of the substrate, while in other embodiments, one of the IC's (e.g., the first IC) is mounted on top of the other IC (e.g., the second IC).

In some embodiments, the first and second IC's and the top side of the substrate on which these IC's are mounted are covered in order to form a single package (i.e., to form the PSiP). In some embodiments, the PSiP includes a cap that encapsulates the top side of the substrate to form a housing that contains the first and second ICs. In other embodiments, the top side of the substrate is covered with a covering fill that covers the first and second IC's. In some cases, the covering fill completely covers the first and second IC's, while in other cases it leaves a portion of one or both of the IC's exposed. The first and second IC's are IC dies in some embodiments. In other embodiments, one or both of the IC's are packaged in another chip scale ("CS") package before placement within the PSiP.

Before mounting this CS-packaged IC into the PSiP, the CS packaging is used to test this IC to ensure that it operates properly. In some cases, the size of the CS package is not greater than a particular percentage (e.g., 120%) of the size of the first IC. The CS package has a flip chip structure in some embodiments.

Instead of, or in conjunction with the CS packaging, the first configurable IC of some embodiments is a defect tolerant configurable IC. The operation of this IC can be adjusted to avoid a certain amount of defects in the manufacturing of the IC. In some embodiments, the configurable IC has configurable logic and interconnect circuits. Some embodiments specify multiple different configuration bit streams for configuring the configurable logic and interconnect circuits of the configurable IC. Some embodiments use place and route tools to specify each configuration bit stream. These tools define the configuration of the logic and interconnect circuits in a manner that allows the logic circuits to perform different functions in the design and the interconnect circuits to route input and output signals to and from the logic circuits.

To specify each configuration bit stream, the place and/or route tools of some embodiments assume that a particular set of the configurable logic and/or interconnect circuits will be defective. After the configurable IC has been manufactured, the configurable IC is tested to identify the set of configurable logic and/or interconnect circuits that are defective. If a particular configuration bit stream was previously defined for the identified set of defective circuits (i.e., if the identified set of defective circuits falls within a set of defective circuits on which a particular configuration bit stream was defined), the particular configuration bit stream is used to configure the configurable IC.

The configurable IC of some embodiments is a reconfigurable IC. Reconfigurable IC's are one type of configurable IC's. Reconfigurable IC's are configurable IC's that can reconfigure during runtime. In other words, a reconfigurable IC is an IC that has reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it receives a different set of configuration data. Some embodiments of the invention are implemented in reconfigurable IC's that are sub-cycle reconfigurable (i.e., can reconfigure circuits on a sub-cycle basis).

In some embodiments, runtime reconfigurability means reconfiguring without resetting the reconfigurable IC. Resetting a reconfigurable IC entails in some cases resetting the values stored in the state elements of the IC, where state elements are elements like latches, registers, and non-configuration memories (e.g., memories that store the user signals as opposed to the memories that store the configuration data of the configurable circuits). In some embodiments, runtime reconfigurability means reconfiguring after the reconfigurable IC has started processing of the user data. Also, in some embodiments, runtime reconfigurability means reconfiguring after the reconfigurable IC has powered up. These definitions of runtime reconfigurability are not mutually exclusive.

In some embodiments, the reconfigurable IC operates at a first clock rate that is faster than a second clock rate of the second IC in some embodiments. In some embodiments, the second IC is also encapsulated in a CS package.

I. Structure of PSiP with Configurable IC
  A. Stacked IC's
  FIG. 1 illustrates an example of a PSiP that includes several IC's that are stacked. As shown in this figure, the PSiP 100 includes a substrate 105, a ball grid array ("BGA") 110, a set of vias 115, a first IC 120, a second IC 125, a third IC 130, a fourth IC 135, a first adhesive 140, a second adhesive 145, a third adhesive 150, a fourth adhesive 155, a first set of wire-bonding 160, a second set of wire-bonding 165, a third set of wire-bonding 170, a fourth set of wire-bonding 175, and a housing 180. In some embodiments, at least one of the IC's 120-135 is a configurable IC, or a reconfigurable IC, as further described below.

As shown in FIG. 1, the substrate 105 serves as a base for creating the PSiP. In some embodiments, the substrate 105 is a non-conducting or insulating material that prevents outside electrical phenomena (e.g., current, voltage) from interfering with the internal IC's (e.g., first, second, third, fourth IC's) of the PSiP 100.

As further shown in FIG. 1, the first IC 120 is located on top of the substrate 105. A first adhesive 140 bonds the first IC 120 to the substrate 105. The second IC 125 is located on top of the first IC 120. The second adhesive 145 bonds the second IC 125 to the first IC 120. The third IC 130 is located on top of the second IC 125. The third adhesive 150 bonds the second IC 125 to the third IC 130. The fourth IC 135 is located on top of the third IC 130. The fourth adhesive 155 bonds the third IC 130 to the fourth IC 135. As shown in this figure, the IC's 120-135 are stacked in a pyramid structure. That is, the IC's 120-135 are stacked bottom to top, from the largest IC to the smallest IC. However, other embodiments might stack the IC's 120-135 differently.

As further shown in FIG. 1, the first IC 120 is communicatively attached to the substrate 105 through the first set of wire-bonding 160. Similarly, each of the IC's 125-135 is communicatively attached to the substrate 105 through a respective set of wire-bonding 165, 170, or 175. These sets of wire-bonding 160-175 allow the first, second, third and fourth IC's 120-135 to communicate with each other without having to go outside of the PSiP 100. In some embodiments, the IC's 120-135 might be directly wire-bonded to each other in order to facilitate communication between these IC's. Instead of, or in conjunction with the sets of wire-bonding 160-175, some embodiments might use other mechanisms to communicatively couple the IC's 120-135 to each other. Furthermore, FIG. 1 illustrates the sets of wire-bonding 160-175 attached to the top surface of the IC's 120-135.

As further shown in FIG. 1, the substrate 105 includes the BGA 110 and the set of vias 115. The BGA 110 is a set of solder balls that allows the PSiP 100 to be attached to a printed circuit board ("PCB"). Each via connects a solder ball in the BGA 110 on the bottom of the substrate 105, to a conductor on the top of the substrate 105.

The conductors on the top of the substrate 105 are electrically coupled to the IC's 120-135 through the sets of wire bonding 160-175. Accordingly, the IC's 120-135 can send and receive signals to and from circuits outside of the PSiP 100 through the sets of wire bonding 160-175, the conductors on the top of the substrate 105, the set of vias 115, and the BGA 110.

Figure 2:
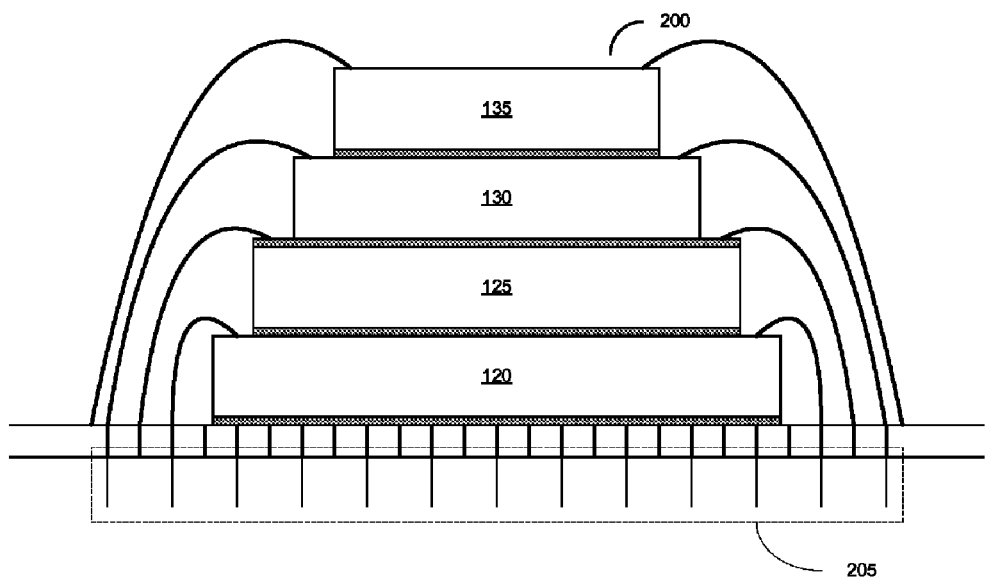
FIG. 2 illustrates a PSiP that includes a pin grid array.

Some embodiments place the BGA 110 in a concentric two-dimensional array at the bottom of the substrate. Other embodiments might place the BGA 110 in other arrangements (e.g., in a peripheral arrangement around the perimeter of the PSiP 100). In other embodiments, a PSiP 200 includes a pin grid array ("PGA") 205, as shown in FIG. 2. The PGA 205 performs the same function as the BGA 110 shown in FIG. 1. As such, in combination with the set of vias 115, the PGA 205 provides an intermediate that allows the IC's 120-135 inside the PSiP 200 to communicate with other IC's outside the PSiP 200.

As further shown in FIG. 1, the housing 180 encapsulates the substrate 105, the BGA 110, the set of vias 115, the IC's 120-135, the adhesives 140-155, the sets of wire-bonding 160-175 to form the PSiP 100. As further described below, other mechanisms and structures can be used to encapsulate the IC's 120-135 to form a single PSiP 200.

In the figures mentioned above and below, the PSiPs are shown attached to a PCB facing up. However, one of ordinary skill in the art will realize that other PSiP structures can be used. For example, some embodiments might use a flip chip structure. In such instances, the PSiPs are flipped over and attached to the PCB facing down.

B. Side by Side IC's

Figure 3:
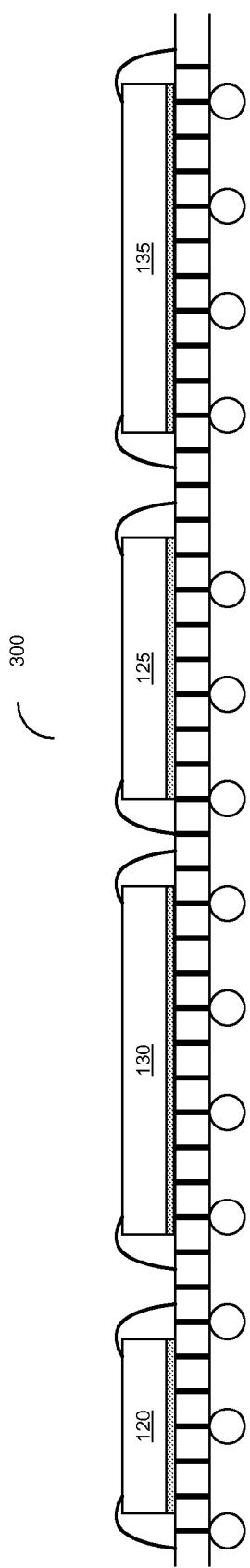
FIG. 3 illustrates a PSiP with IC's that are placed side by side.

FIG. 3 illustrates an example of a PSiP 300 that includes several IC's that are placed side by side to each other. As shown in this figure, the first, second, third and fourth IC's 120-135 are located on top of the substrate 105. In some embodiments, at least one of the IC's 120-135 is a configurable IC or a reconfigurable IC, as further described below.

In the PSiP 300, each IC is placed side by side to each other. A first adhesive 140 is placed between the first IC 120 and the substrate 105 to bond them together. Similarly, a second, third and fourth adhesive 145-155 are respectively placed between the second, third and fourth IC 125-135 and the substrate 105. First, second, third and fourth sets of wire-bonding 160-175 are attached respectively to the first, second, third and fourth IC's 120-135. These sets of wire-bonding 160-175 allow the IC's 120-135 (1) to communicate with each other without having to go outside of the PSiP, and (2) to communicate with IC's that are located outside of the PSiP 300.

The PSiP 300 includes a BGA 110 and a set of vias 115. As previously mentioned, the BGA 110 and the set of vias 115 allow the IC's 120-135 to communicate with IC's outside of the PSiP 300. In contrast to the PSiP 100 with stacked IC's, which provides a PSiP that is narrow, the PSiP 300 that includes side by side IC's provides a PSiP that is thin.

iii. Combination of Stacked and Side by Side IC's

Figure 4:
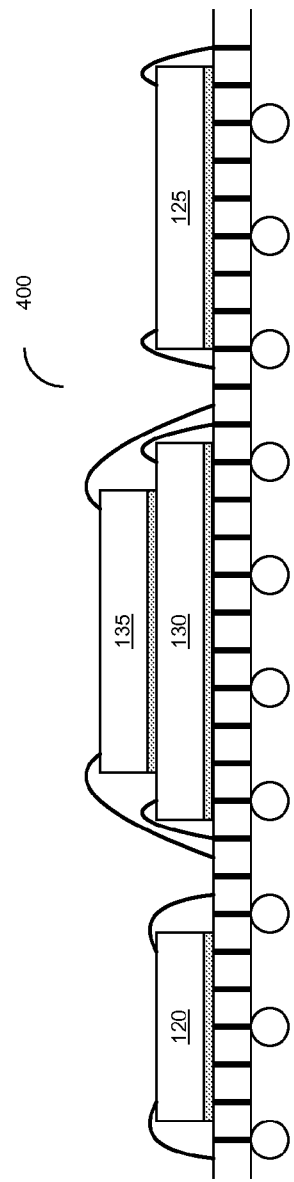
FIG. 4 illustrates a PSiP with IC's that are stacked and placed side by side.

FIG. 4 illustrates an example of a PSiP 400 that includes a combination of stacked and side by side IC's. In such an embodiment, some IC's of the PSiP 400 are stacked on top of each other, while other IC's of the PSiP 400 are placed side by side to each other. As shown in this figure, first, second and third IC's 120-130 are placed on top of a substrate 105. First, second and third adhesives 140-150 respectively bond the first, second and third IC's 120-130 to the substrate 105. A fourth IC 135 is placed on top of the third IC 130. A fourth adhesive 155 bonds the fourth IC 135 to the third IC 130. In some embodiments, at least one of the IC's 120-135 is a configurable IC or a reconfigurable IC, as further described below.

Furthermore, the PSiP 400 includes first, second, third and fourth sets of wire-bonding 160-175 that are attached respectively to the first, second, third and fourth IC's 120-135. As previously described, these sets of wire-bonding 160-175 allow the IC's 120-135 to communicate with each other. In other embodiments, the PSiP 400 further includes a BGA 110 and a set of vias 115 to allow the IC's 120-135 to communicate with IC's outside of the PSiP 400.

II. PSiP with Reconfigurable IC's

Figure 5:
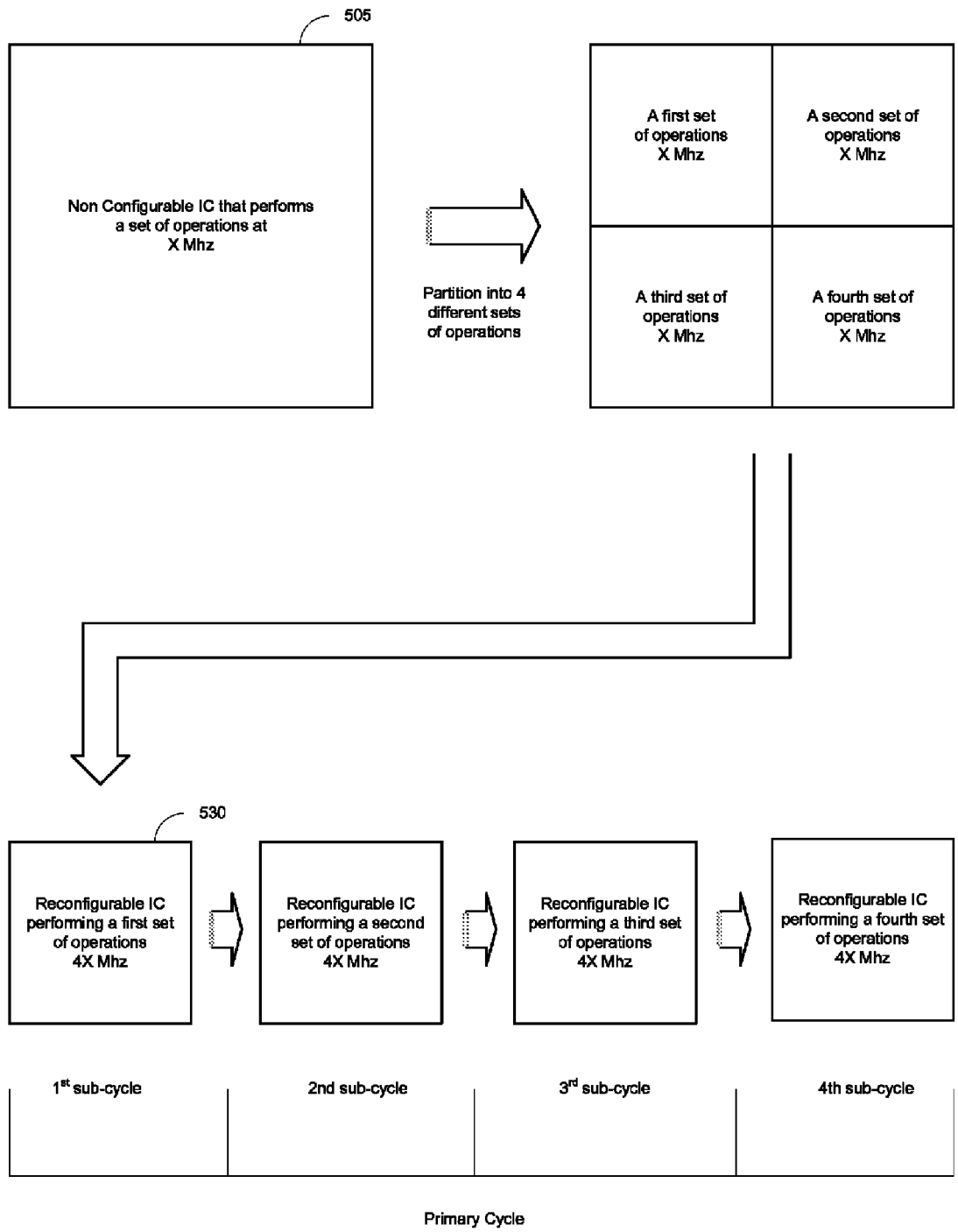
FIG. 5 illustrates a reconfigurable IC that can perform the operations of a non configurable IC.

In some embodiments, the configurable IC of the PSiP's described above is a reconfigurable IC that reconfigures more than once during runtime. In some embodiments, this reconfigurable IC might be a sub-cycle reconfigurable IC. FIG. 5 conceptually illustrates an example of a sub-cycle reconfigurable IC. Specifically, in its top left hand corner, this figure illustrates a non-configurable IC 505 that operates at a clock speed of X MHz. As further illustrated in this figure, the operations performed by this non-configurable IC 505 can be partitioned into four sets of operations that are each performed at a clock speed of X MHz.

FIG. 5 then illustrates that these four sets of operations can be performed by one sub-cycle reconfigurable IC 530 that operates at 4X MHz. In some embodiments, four cycles of the 4X MHz clock correspond to four sub-cycles within a cycle of the X MHz clock. Accordingly, this figure illustrates the reconfigurable IC 530 reconfiguring four times during four cycles of the 4X MHz clock (i.e., during four sub-cycles of the X MHz clock). During each of these reconfigurations (i.e., during each sub-cycle), the reconfigurable IC 530 performs one of the identified four sets of operations. In other words, the faster operational speed of the reconfigurable IC 530 allows this IC to reconfigure four times during each cycle of the X MHz clock, in order to perform the four sets of operations sequentially at a 4X MHz rate instead of performing the four sets of operations in parallel at an X MHz rate.

Figure 6:
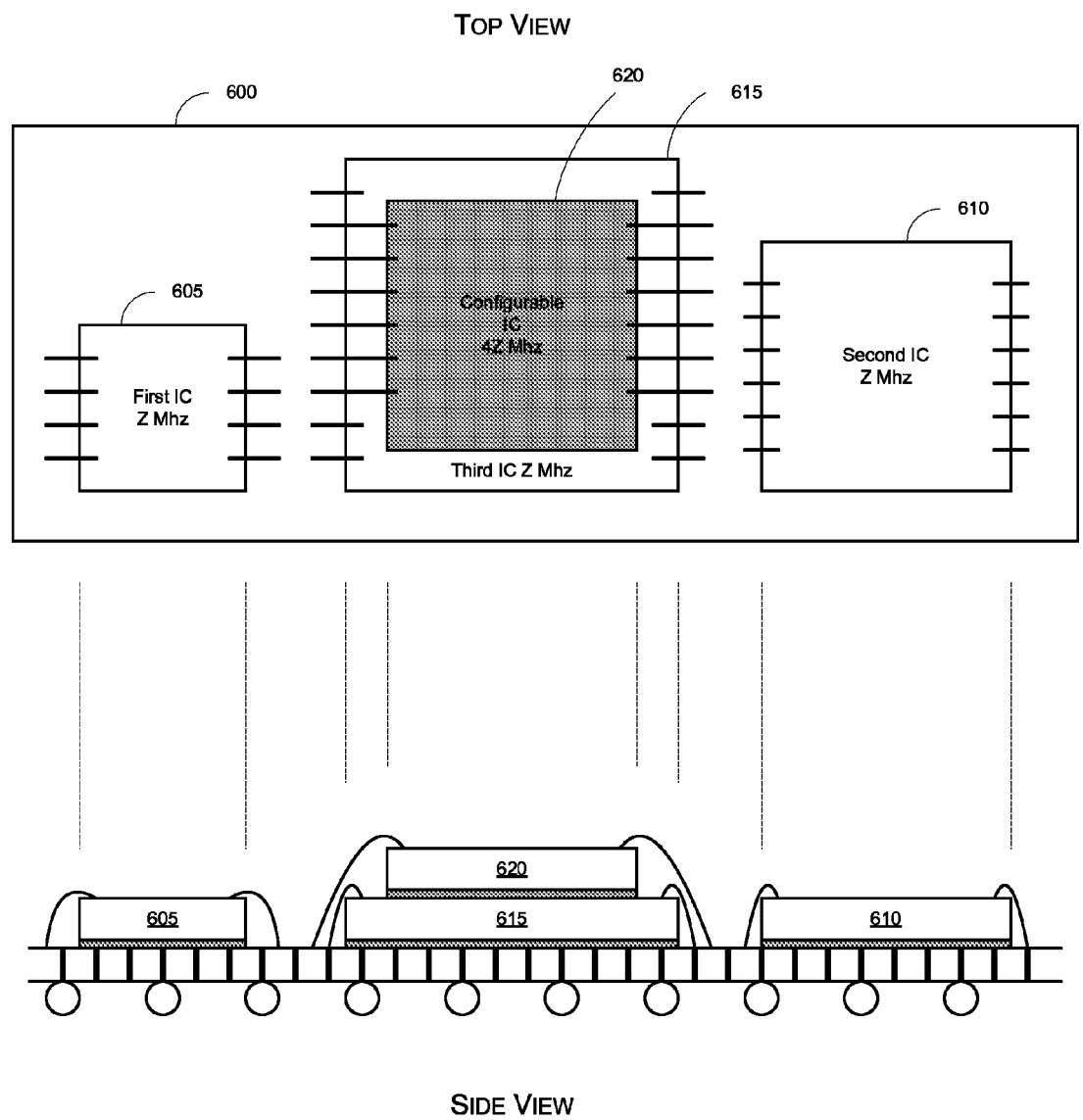
FIG. 6 illustrates a PSiP with a reconfigurable IC stacked on top of non configurable IC's.

In some embodiments, a reconfigurable IC 530 reconfigures at a clock speed that is comparatively faster than the clock speed of some or all other IC's within a PSiP. FIG. 6 illustrates an example of such a PSiP. Specifically, this figure illustrates a PSiP 600 that includes first, second, third and fourth IC's 605-620. The first, second and third IC's 605-615 are non configurable IC's. As shown in this figure, each of the first, second and third IC's 605-615 operates at a clock speed of Z MHz or less. The fourth IC 620 is a reconfigurable IC which operates at a clock speed of 4Z MHz.

As shown in FIG. 6, the clock speed of the reconfigurable IC 620 is comparatively faster than the clock speed of the first, second and third IC's 605-615. In other embodiments, the clock speed of the reconfigurable IC 620 is comparatively faster than the clock speed of either the first, second or third IC 605-615.

III. Mixed Fabrication Technology

As mentioned above, the IC's within a PSiP can perform many operations. Examples of operations include a processor operation, an analog operation, a memory operation, etc. In some embodiments, these IC's are manufactured using different fabrication technologies. For instance, an IC that performs memory operations might be manufactured using 90 nm fabrication technology, while an IC that performs a processor operation might be manufactured using 130 nm fabrication technology, and an IC that performs analog operations might be manufactured using 180 nm.

Figure 7:
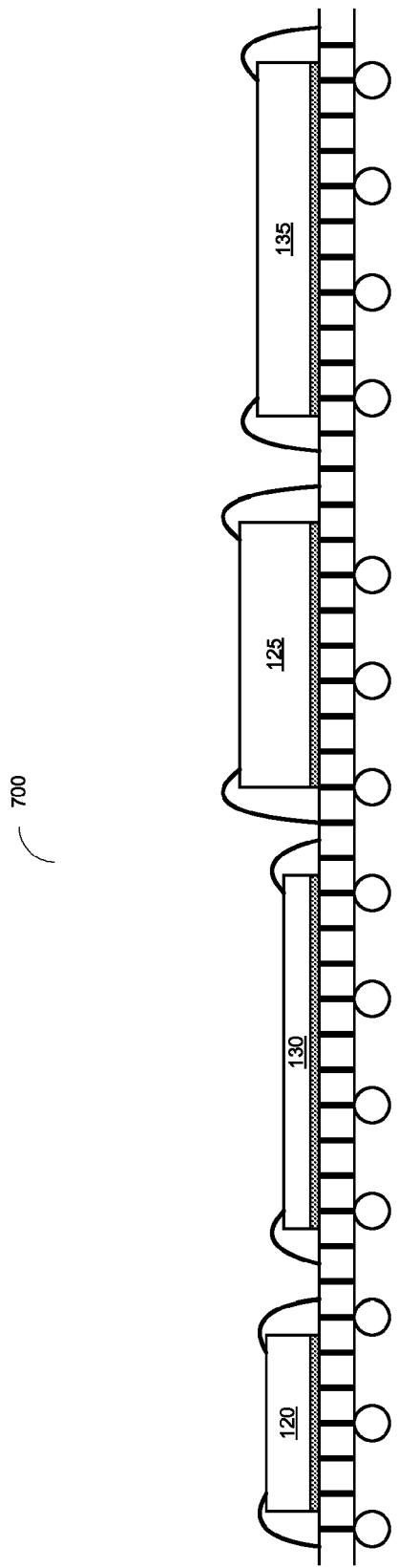
FIG. 7 illustrates a PSiP with IC's that have different manufacturing processes.

FIG. 7 conceptually illustrates a PSiP 700 that includes IC's with different fabrication technologies. The PSiP 700 includes first, second, third and fourth IC's 120-135 that are placed on top of the substrate 105. At least one of the IC's 120-135 is a configurable IC. In this figure, the IC's 120-135 have different dimensions (e.g., width, height) to illustrate pictorially and conceptually that some of the IC's 120-135 are manufactured with different fabrication technologies. Irrespective of the conceptual illustration in FIG. 7, one of ordinary skill will realize that using different manufacturing fabrication technologies might not result in IC's with different dimensions.

IV. PSiP with Heat Sink

Figure 8:
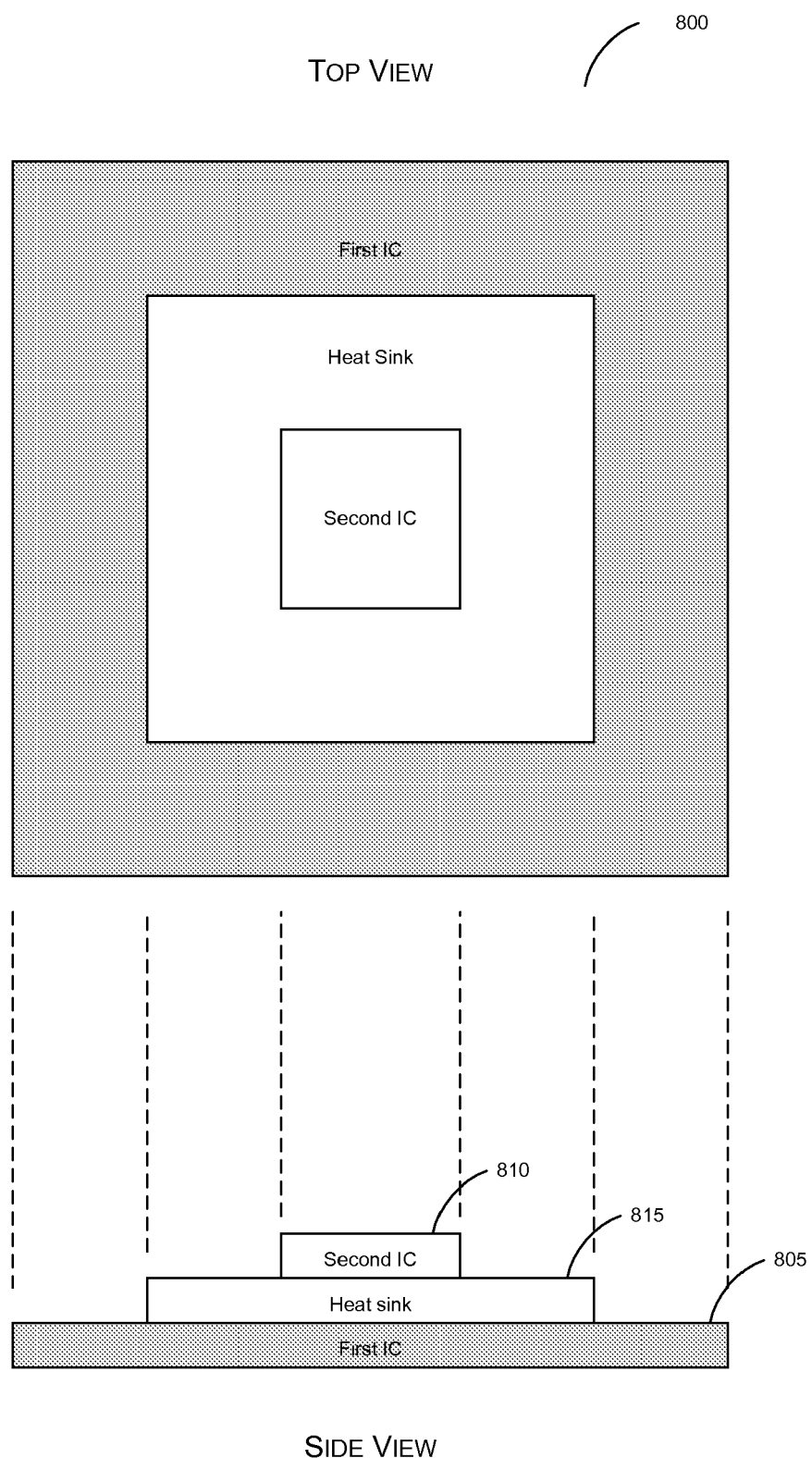
FIG. 8 illustrates a PSiP with a heat sink in the PSiP.

In some embodiments, a PSiP includes a heat sink (i.e., heat spreader). FIG. 8 illustrates an example of such a PSiP. As shown in this figure, the PSiP 800 includes a first IC 805 and a configurable IC 810. The configurable IC 810 is a reconfigurable IC in some embodiments. As shown in FIG. 8, the PSiP 800 also includes a heat sink 815 between the first IC 805 and the configurable IC 810. The heat sink 815 helps dissipate heat from the configurable IC 810 in the PSiP 800.

Figure 9:
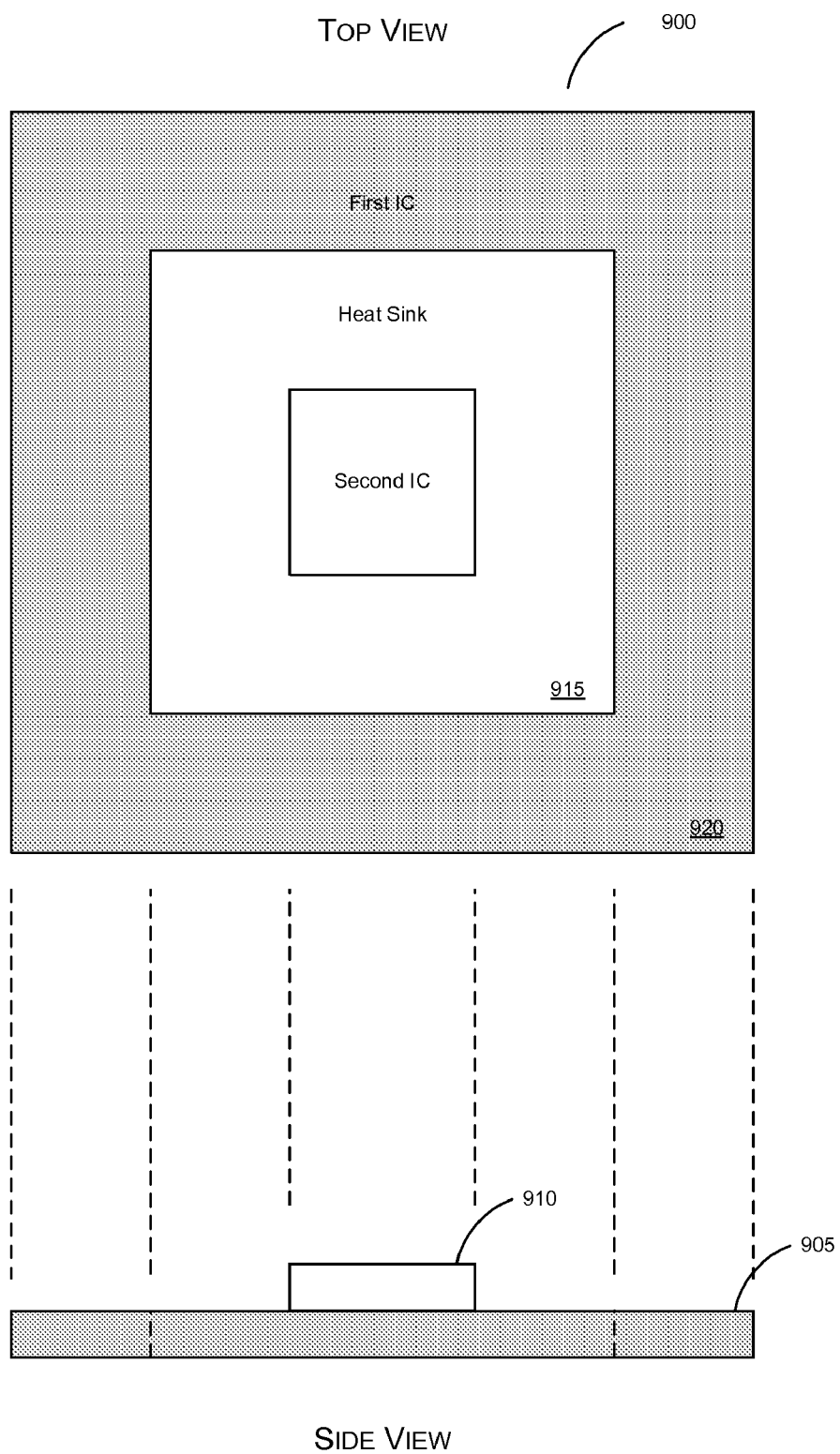
FIG. 9 illustrates a PSiP with a heat sink embedded in the first IC of the PSiP.

FIG. 9 illustrates another embodiment of a PSiP that includes a heat sink (i.e., heat spreader). As shown in this figure, the PSiP 900 includes a first IC 905 and a configurable IC 910. The configurable IC 910 is a reconfigurable IC in some embodiments. As shown in FIG. 9, the first IC 905 includes (1) a center area 915 on which no circuits are defined, and (2) a periphery area 920 on which circuit elements (e.g., transistors, resistors, wires, etc.) are defined. The center area 915 serves as a heat sink on which configurable IC 910 is positioned. In other words, the center area 915 helps dissipate heat from the configurable IC 910 in the PSiP 900.

Having described various PSiP's that include configurable or reconfigurable IC's, a method of manufacturing a PSiP and selecting the IC's for the PSiP will now be described in detail.

V. Manufacturing PSiP

Figure 10:
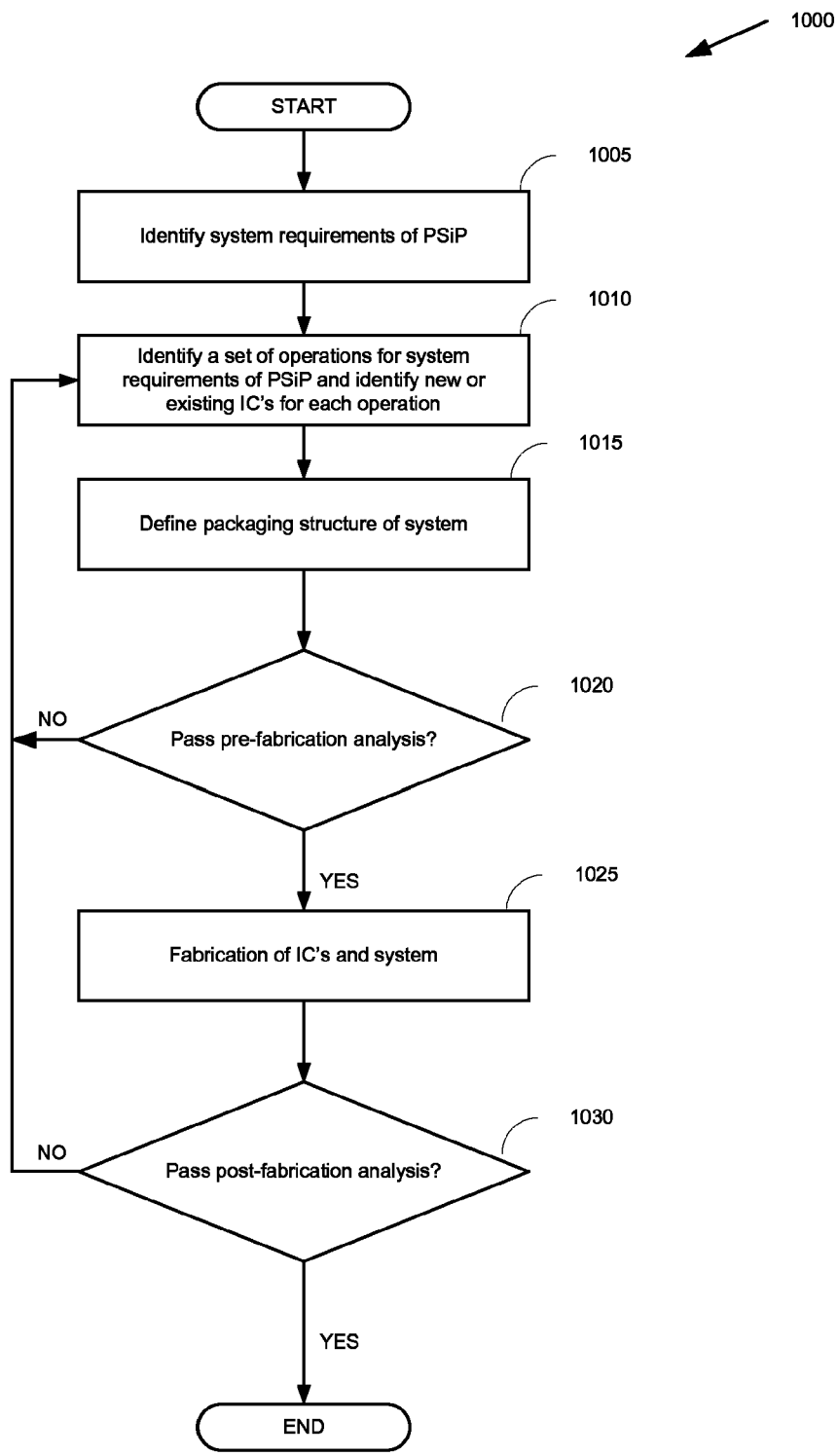
FIG. 10 illustrates a process of manufacturing a PSiP.

FIG. 10 conceptually illustrates a process 1000 for manufacturing a PSiP. As shown in this figure, the system requirements of the PSiP are initially identified (at 1005). That is, this operation identifies what performance objectives the PSiP has to achieve. After identifying (at 1005) the system requirements of the PSiP, sets of operations that are necessary for achieving the identified system requirements are identified at 1010. For each set of operations identified at 1010, a determination is made (at 1010) whether to implement the set of operations by using an existing IC or a new IC that will be specifically designed or configured to implement the set of operations. In some embodiments, at least one of the IC's identified at 1010 is a configurable IC. In some of these embodiments, this configurable IC is a reconfigurable IC that reconfigures more than once during run time (e.g., it is sub cycle reconfigurable IC). The operation at 1010 will be further described below by reference to FIG. 11.

After identifying new or existing IC's, a PSiP structure is identified (at 1015) for housing all the identified IC's. As described above, a PSiP can be structured in numerous ways. In some embodiments, a PSiP can include IC's that are stacked. In other embodiments, a PSiP can include IC's that are placed side by side. In yet other embodiments, a PSiP can include IC's that are placed side by side and stacked.

After defining (at 1015) the structure of the PSiP, a pre-fabrication analysis is performed (at 1020) to determine whether the designed PSiP is likely to satisfy the system requirements. If the designed PSiP fails this analysis, the process (1) returns back to 1010 to redefine the sets of operations and/or to modify the IC selection/design choices, and then (2) transitions to 1015 to define a PSiP structure for housing the IC's identified at 1010.

When the PSiP design passes the pre-fabrication analysis at 1020, the PSiP is manufactured (at 1025) based on the IC's identified in the last iteration of 1010 and the PSiP structure identified in the last iteration of 1015. In some embodiments, the manufacturing process entails purchasing and/or configuring only existing IC's to produce the desired PSiP. In other embodiments, the manufacturing process entails manufacturing at least one new IC to produce the PSiP.

After manufacturing the PSiP, the manufactured PSiP is tested (at 1030) to determine whether the manufactured PSiP meets the system requirements that were identified (at 1005). If not, the process returns to 1010, which was described above. When the manufactured PSiP passes the post-fabrication analysis at 1030, then the process 1000 ends.

VI. Identifying Reconfigurable Ic's for PSiP

Figure 11:
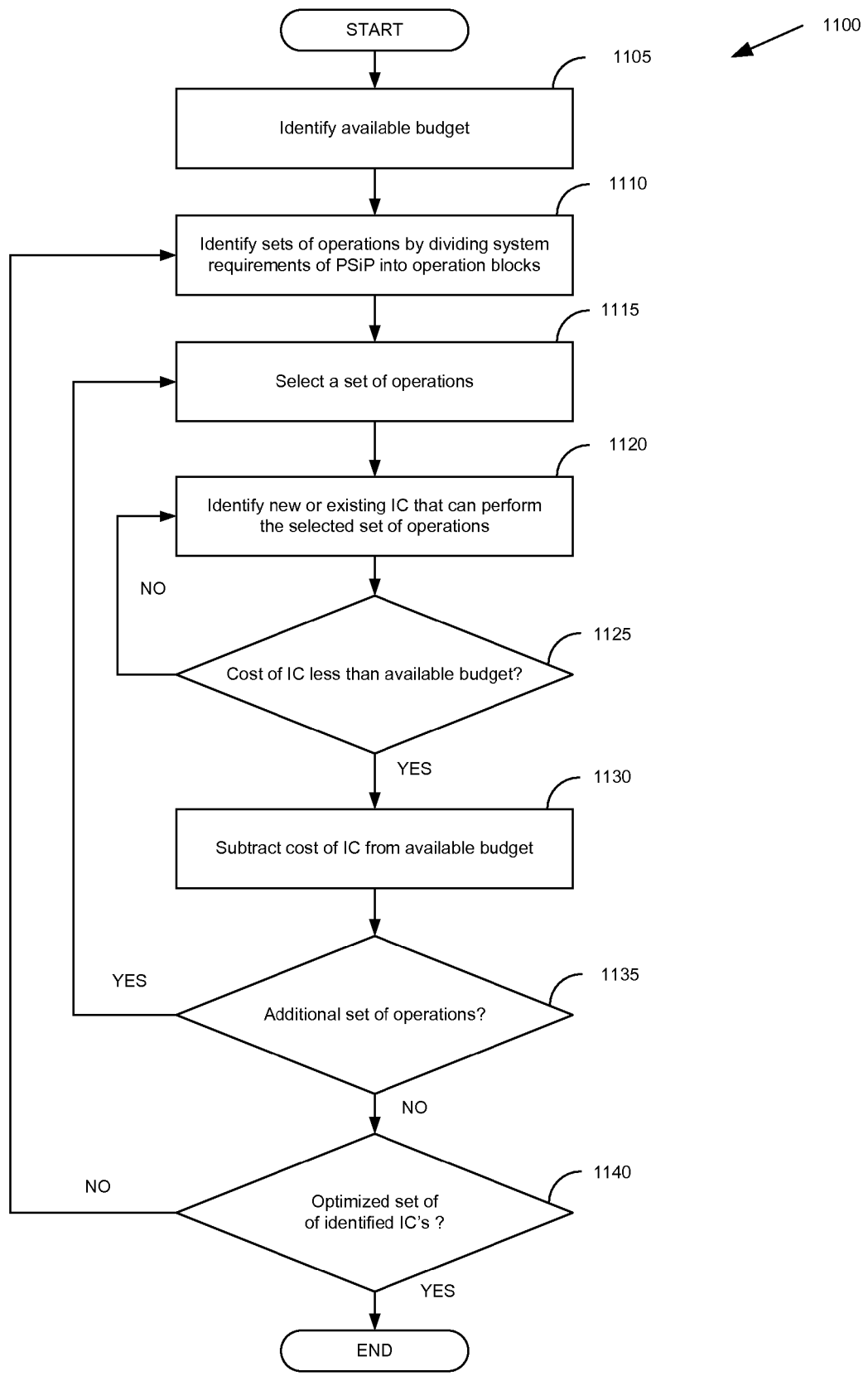
FIG. 11 illustrates a method of identifying IC's for a PSiP.

FIG. 11 conceptually illustrates a process 1100 for selecting and identifying IC's to be used in a PSiP. Some embodiments perform the process 1100 to implement the design operation 1010 in FIG. 10. As shown FIG. 11, an available budget for producing the PSiP is initially identified at 1105. In some embodiments, this budget is predicted on producing a certain number of PSiP's. Also, in some embodiments, the identified budget accounts for all funds necessary (1) for designing, configuring and manufacturing new IC or IC's if such IC's are required by the PSiP, and (2) for acquiring and/or configuring an existing IC. In other embodiments, this amount also includes the cost of the PSiP packaging, assembling, and/or testing.

Figure 12:
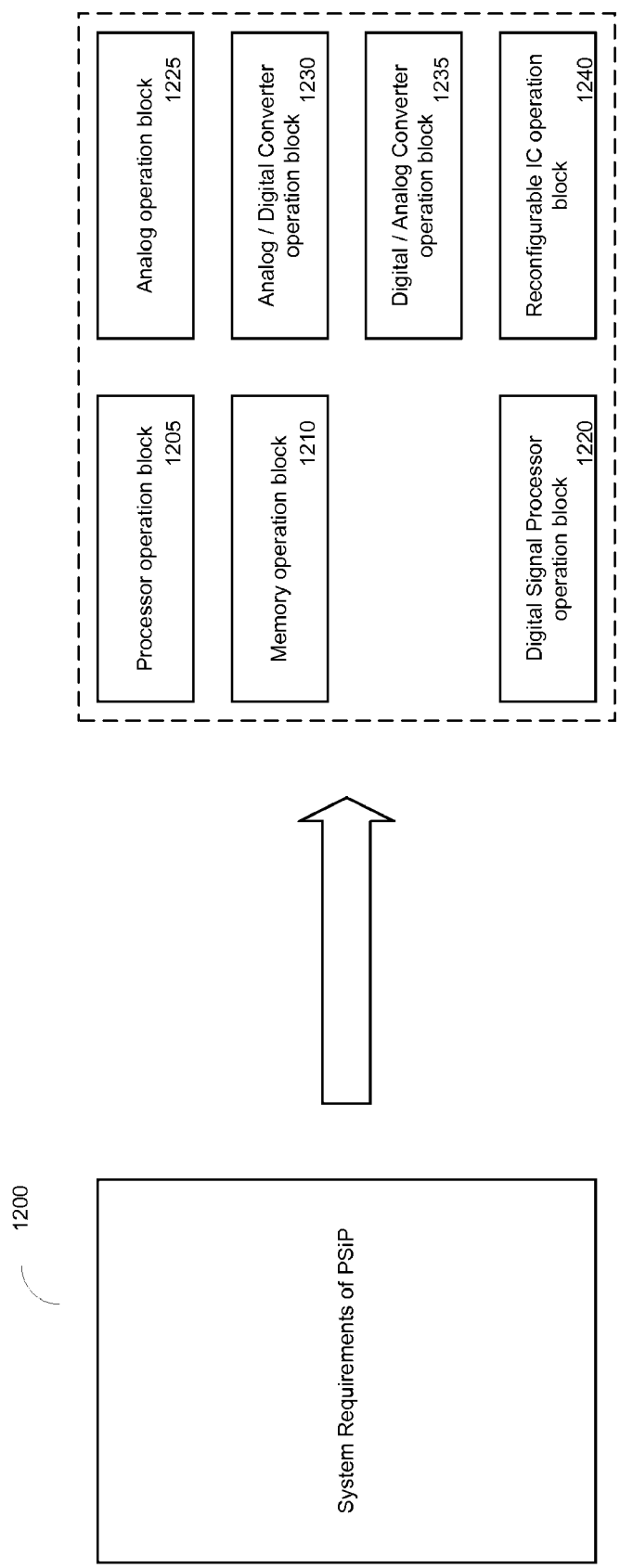
FIG. 12 illustrates an example of a system for a PSiP divided into a set of operations.

Once the available budget has been defined (at 1105), sets of operations are identified (at 1110) by dividing the system requirements of the PSiP into several operational blocks, where each operational block represents a set of operations that the PSiP has to perform. FIG. 12 conceptually illustrates an example of dividing the system requirements for a PSiP into several operational blocks. In this example, the operational blocks include a processor operation block 1205, a memory operation block 1210, a digital signal processor operation block 1220, an analog operation block 1225, an analog/digital converter operation block 1230, a digital/analog converter operation block 1235, and a reconfigurable IC operation block 1240. As mentioned above, each operational block includes a set of operations that the PSiP has to perform. For instance, the processor operation block 1205 may include a set of processing operations that the PSiP has to perform.

Once the sets of operations have been identified (at 1110) by dividing the system requirement of the PSiP into several operational blocks, one or more sets of operations are selected at 1115 (i.e., selects at least one or more operational blocks). After selecting one or more sets of operations at 1115, an IC that can perform the selected set or sets of operations is identified at 1120. The identified IC might be an existing IC that can perform or can be configured to perform the set or sets of operations selected at 1115. Alternatively, the identified IC might be an IC that has to be designed to perform, or has to be designed to be configured to perform, the selected set of operations. In at least one iteration through 1120, the selected IC is a configurable IC. In some cases, the configurable IC is a reconfigurable IC that can reconfigure more than once at run time.

Different identified IC's perform the selected set or sets of operations differently. For instance, a non-configurable IC that is identified at 1120 might perform in parallel the operations in the set or sets of operations selected at 1115. Alternatively, the IC identified at 1120 might be a configurable IC that can be configured to perform in parallel the operations in the set or sets of operations selected at 1115. On the other hand, the IC identified at 1120 might be a reconfigurable IC that sequentially performs one or more sub-sets of the operations in the set(s) of operations selected at 1115 during different reconfiguration sub-cycles.

Once the IC is identified at 1120, a determination is made (at 1125) as to whether the actual or estimated cost of the identified IC is less than the available budget. When the selected IC is a previously designed IC, the cost of the IC is the cost associated with purchasing, manufacturing, and/or configuring the previously designed IC. When the selected IC is an IC that has yet to be designed, the cost of the IC is the cost associated with designing, testing, manufacturing, and/or configuring the IC. Furthermore, in some embodiments, the cost of the IC accounts for costs associated with packaging and assembling the IC within the PSiP. In such embodiments, the process 1100 might perform the package-defining operation 1015 of the process 1000 of FIG. 10, or might simply account for the probable cost of such a packaging.

If the cost of the identified IC is not less than the available budget, the process 1100 proceeds back to 1120 to identify another IC for the selected set of operations. However, if the cost of the identified IC is less than the available budget, the process 1100 subtracts (at 1130) the cost of the identified IC from the available budget.

Once the cost of the identified IC has been subtracted from the available budget, a determination is made (at 1135) whether there is an additional set of operations that has not yet been associated with an IC. If so, the process 1100 (1) returns back to 1115 to select other set or sets of operations that have not yet been selected, and then (2) proceeds to 1120 to identify another IC for the newly selected set or sets of operations.

When it is determined (at 1135) that there is no additional set of operations, a determination is made (at 1140) whether the identified set of IC's is a good enough set of IC's for implementing the PSiP. For instance, when the identified set of IC's includes a reconfigurable IC, a determination might be made (at 1140) that the reconfigurable IC can perform additional operations in order to reduce the overall cost of the PSiP. Such additional operations would be operations that were previously identified for another IC. When a determination is made (at 1140) that the set of IC's is a good enough set, the process 1100 ends.

A PSiP, i.e., a SiP with a configurable or reconfigurable IC, has many advantages. A PSiP provides a simple solution for combining the often desirable configurable functionality of a configurable or reconfigurable IC with the functionalities commonly provided by other IC's. PSiP's are easier to design than the currently proposed SoC solutions that combine configurable functionality of configurable IC's with other IC functionalities.

Also, the IC's of a PSiP can be manufactured by different fabrication technologies. Hence, optimal fabrication processes can be used to manufacture the IC's of the PSiP. This is to be contrasted with the prior SoC solutions that require the use of one fabrication process for all the operational blocks on the SoC, which results in some of the operational blocks being manufactured by fabrication processes that are far from their optimal fabrication technology.

VII. Chip Scale Wafer Packaging

A. Overview

As mentioned above, the PSiP of some embodiments includes several IC's where one of the IC's is a configurable IC. In some embodiments, the configurable IC is a reconfigurable IC that can reconfigure more than once during "run time." Some embodiments encapsulate the configurable IC in a chip scale package ("CSP") and package the CSP in the PSiP. In some embodiments, the CSP is a package that is about the same size as the IC. However, different embodiments use different CS package sizes. In some embodiments, the size (measured by area or volume) of the CSP is not greater than 120 percent of the size of the IC. A chip scale package may also be referred to as wafer scale ("WS") package.

B. Process for Manufacturing PSiP That Includes a CS Package

Figure 13:
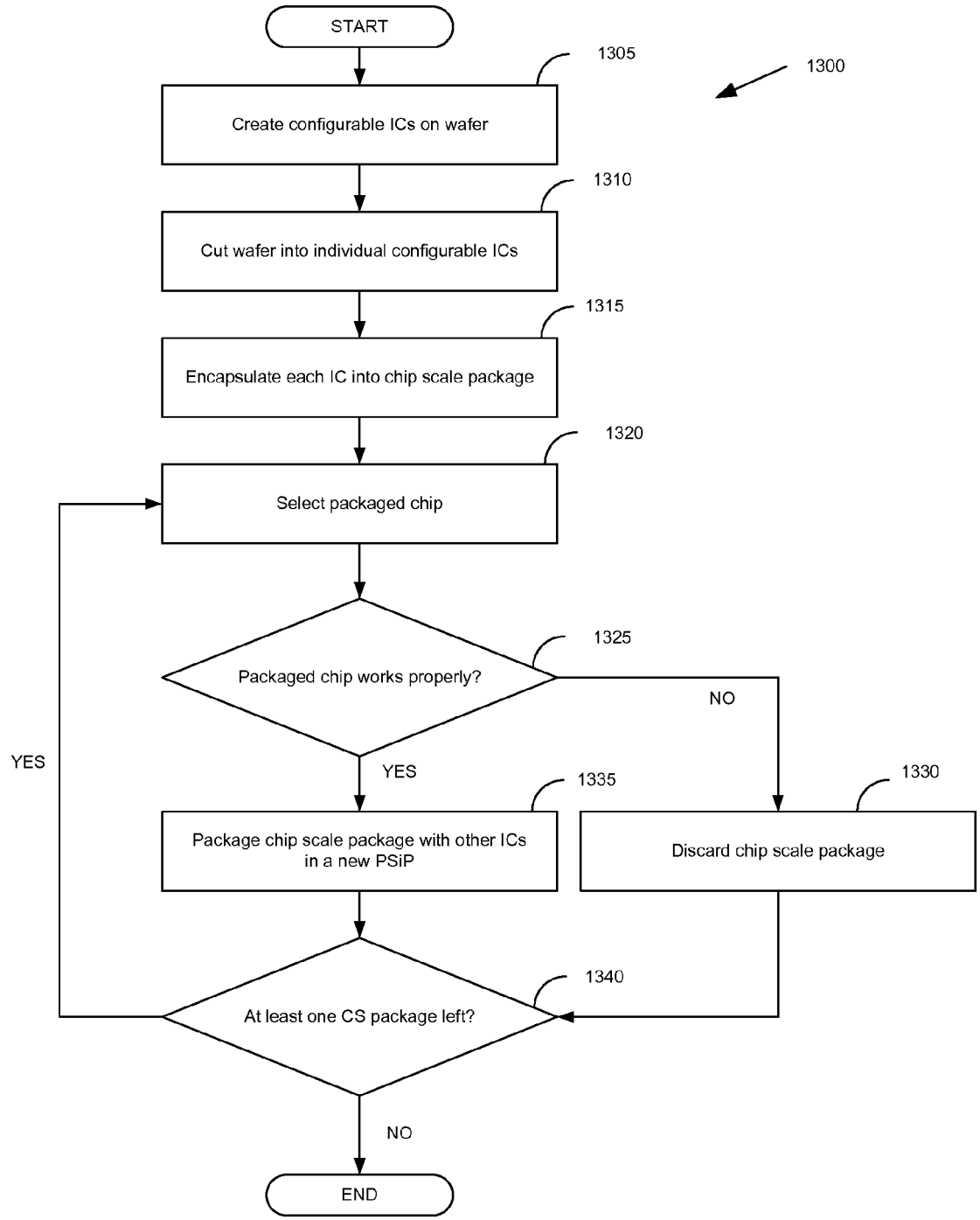
FIG. 13 illustrates a process for manufacturing a PSiP that includes a CS package.
Figure 14:
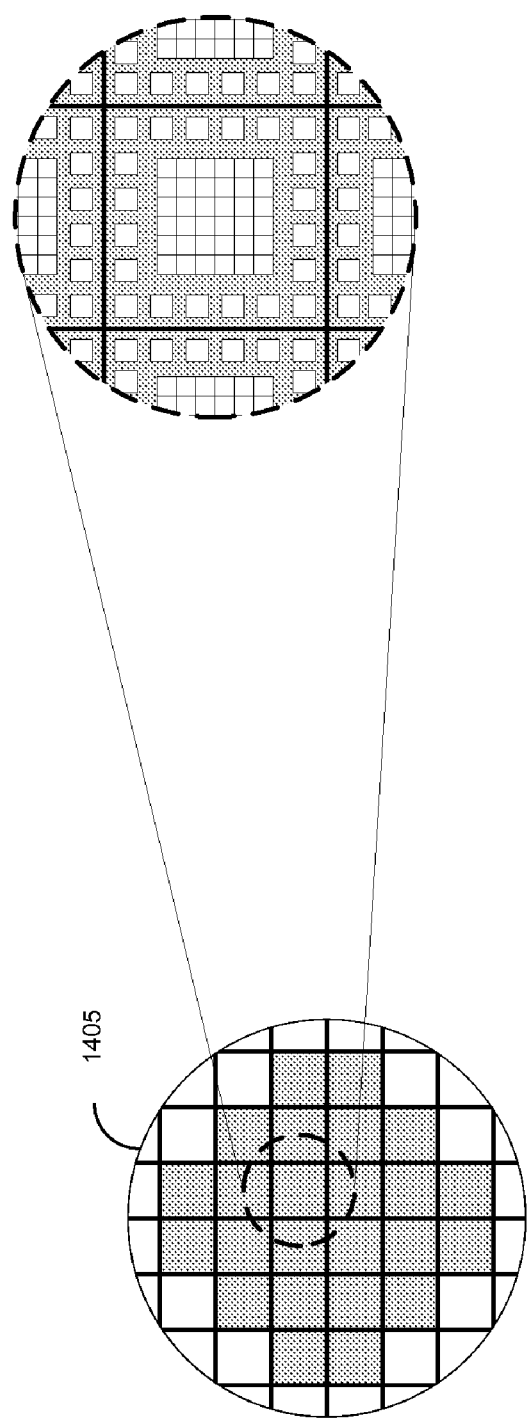
FIG. 14 illustrates a wafer with several configurable IC's.
Figure 15:
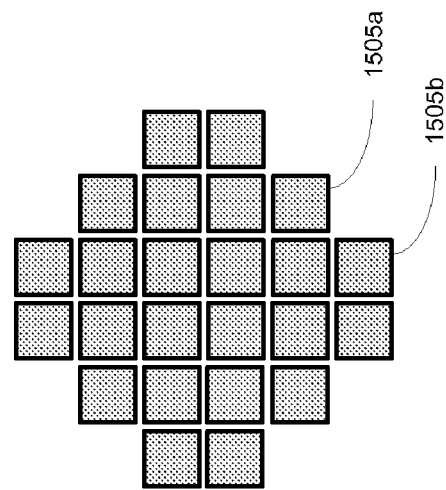
FIG. 15 illustrates a wafer being diced into several individual configurable IC's.
Figure 15:
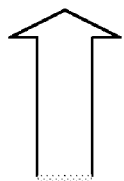
Figure 15:
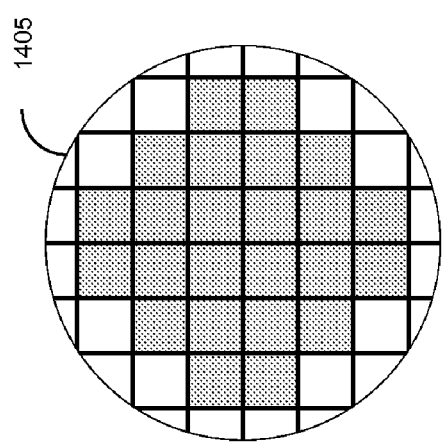

FIG. 13 conceptually illustrates a process 1300 for manufacturing PSiP's with configurable IC's in CSP. In some embodiments, the process 1300 is performed during step 1025 of the process 1000, which was described above. The process 1300 first manufactures (at 1305) several configurable IC's on a wafer, as shown in FIG. 14. Specifically, FIG. 14 illustrates a wafer 1405 that includes several configurable IC's. After manufacturing the IC's on the wafer 1405, the process 1300 dices (at 1310) the wafer 1405 into several individual IC's 1505. FIG. 15 illustrates a wafer 1405 cut into several configurable IC's 1505.

Figure 17A:
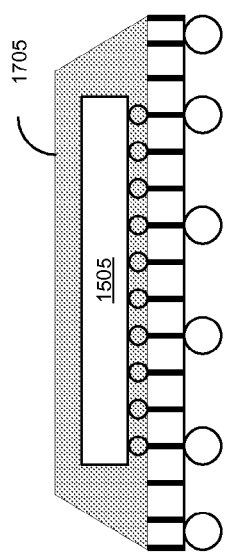
FIG. 17A illustrates a configurable IC with a flip chip structure encapsulated in a CS package with a fill.
Figure 17B:
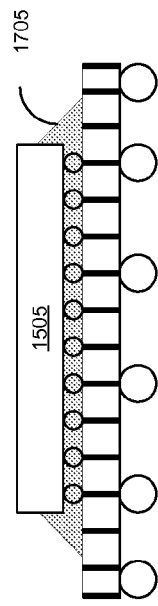
FIG. 17B illustrates a configurable IC with a flip chip structure encapsulated in a CS package with a fill, where a portion of the configurable IC is exposed.

Once the configurable IC's are cut, the process 1300 encapsulates (at 1315) each configurable IC in a CSP. In some embodiments, the CSP includes many of the same components as the PSiP described above. Namely, in some embodiments, a CSP 1605 includes a substrate, a set of solder balls, a set of wire bonding, adhesive, and a cap 1605 for encapsulating the configurable IC 1505, as shown in FIG. 16A. In some embodiments, the CSP 1605 has a flip chip structure, as shown in FIG. 16B. A flip chip is a package where the IC is flipped over and coupled to the substrate (e.g., by using a set of solder balls), such that the active surface (i.e., the surface on which device is built) of the IC faces the substrate. Alternatively, some embodiments of the CSP use a fill to encapsulate the configurable IC 1505, as shown in FIGS. 17A and 17B. As illustrated in these figures, the fill 1705 can entirely encapsulate the configurable IC 1505, as shown in FIG. 17A, or can encapsulate up to the inactive side of the configurable IC 1505, as shown in FIG. 17B. After packaging (at 1315) the IC, the process 1300 selects (at 1320) one of the CSP's that were packaged at 1315.

Next, the process 1300 determines (1325) whether the CSP works properly. In some embodiments, the CSP is placed on a printed circuit board that is for testing CSP IC's, and tested to ensure that the configurable IC works as designed. In some embodiments, the CSP is tested for numerous functionalities of the configurable IC using conventional CS packaging techniques and equipment.

If the process 1300 determines (at 1325) that the CS package does not work, the process 1300 discards (at 1330) the CSP and proceeds to 1340. However, if the process 1300 determines (at 1325) that the CSP works properly (i.e., passes test), the process 1300 packages (at 1335) the CSP with other IC's in a new PSiP and then proceeds to 1340.

Figure 18:
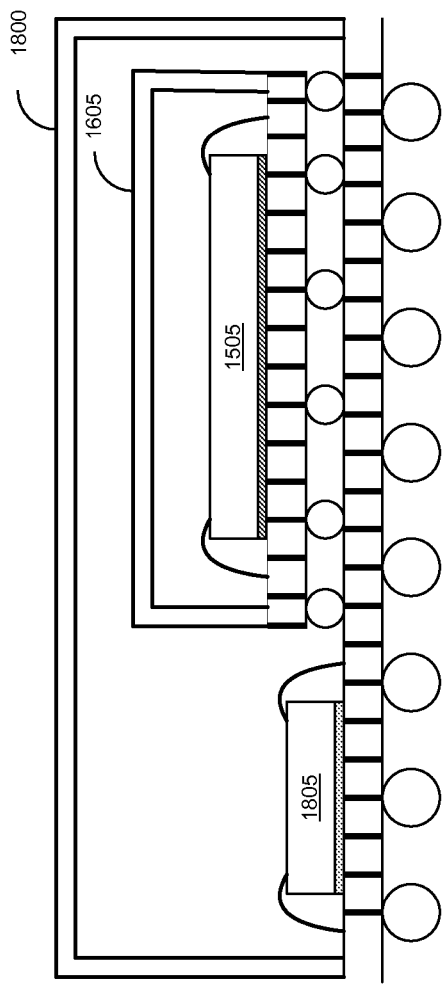
FIG. 18 illustrates a CS packaged IC encapsulated in a PSiP.
Figure 19:
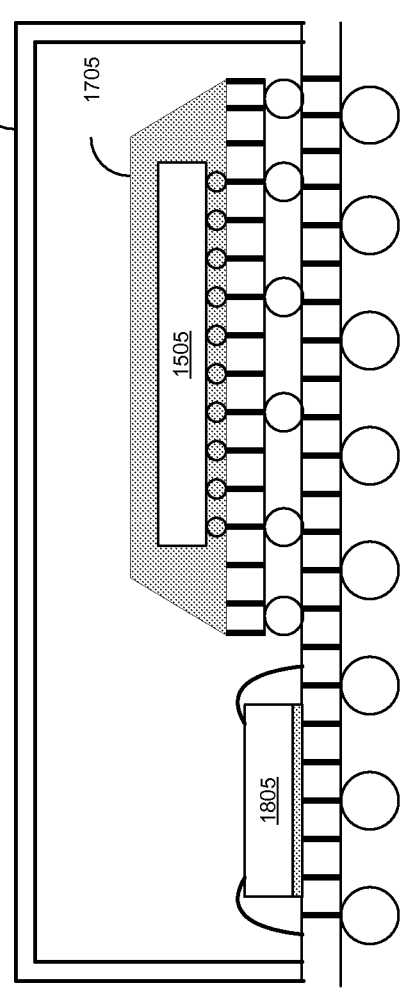
FIG. 19 illustrates a CS packaged IC having a flip chip structure encapsulated in a PSiP.

FIGS. 18 and 19 illustrate two PSiP's 1800 and 1900. Each of these PSiP's includes a configurable IC encapsulated in a CSP. The PSiP 1800 of FIG. 18 includes an IC 1805 and a CSP 1605, where the CSP 1605 includes a configurable IC 1505 wire-bonded to the CS package 1605. The PSiP 1900 of FIG. 19 includes an IC 1505 and a configurable CSP 1605, where the CSP 1605 has a flip chip structure.

At 1340, the process 1300 determines whether there are any remaining CSP's that were packaged at 1315. If so, the process 1300 proceeds to 1320 to select another CSP. The process 1300 ends when the process 1300 determines (at 1340) that there are no configurable IC's that it has to package in a CSP.

In the above process 1300, several IC's are packaged (at 1335) in the PSiP with one CSP. However, in some embodiments, the PSiP may include more than one CSP, where one or more of these CSP's may encapsulate IC's that are not configurable.

Figure 20:
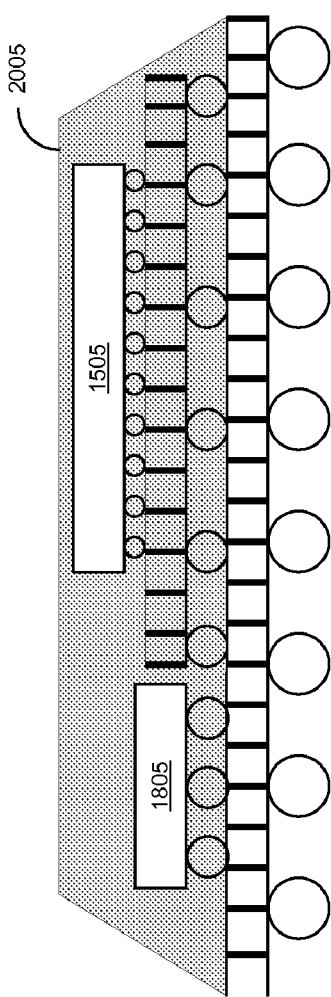
FIG. 20 illustrates a CS packaged IC and a second IC encapsulated by a fill.
Figure 21:
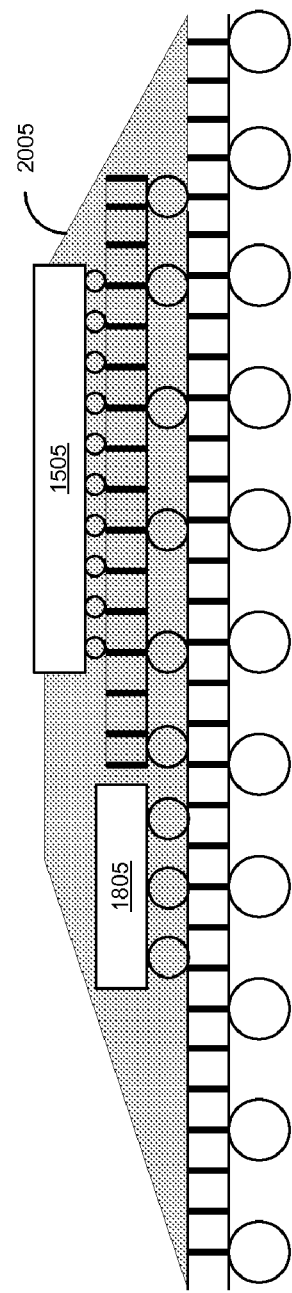
FIG. 21 illustrates a CS packaged IC and a second IC encapsulated by a fill, where a portion of the configurable IC is exposed.

In some of the above mentioned figures, the configurable IC is encapsulated in a CSP with a cap 1800, as shown in FIGS. 18 and 19. However, in some embodiments, the configurable IC is encapsulated in a CSP with fill, as shown in FIGS. 20 and 21. Specifically, FIG. 20 illustrates a configurable IC 1505 with a flip chip structure. Both IC's 1805 and 1505 are encapsulated by a fill 2005, where the fill 2005 covers both the configurable IC 1505 and the IC 1805. In some embodiments, the fill 2005 might not encapsulate all the IC's in a PSiP, but might leave a surface of one or more IC's bare, as shown in FIG. 21. Specifically, this figure illustrates a configurable IC 1505 with a flip chip structure. Both IC's 1805 and 1505 are encapsulated by the fill 2005, where the fill 2005 covers both the configurable IC 1505 and the IC 1805, but leave a portion (e.g., bottom surface) of the configurable IC 1505 bare.

Furthermore, in some embodiments, only the under fill of the configurable IC (i.e., area that includes the set of solder balls) is covered by the fill 2005, leaving the sides of the configurable IC 1505 bare. In some embodiments, the sides of the configurable IC are left uncovered for heat sink purposes.

C. Advantages

Typically, a PSiP is rigorously tested to make sure that the PSiP works properly (i.e., works as designed). In some cases, the entire PSiP (including IC's in the PSiP that work properly)

is discarded when the PSiP cannot pass its test. Since PSiP's often include more than one IC, it is advantageous to test the configurable IC before packaging it to the PSiP. By discarding "bad" configurable IC's (e.g., IC that does not work properly) before packaging them in the PSiP, the number of discarded "good" IC's (i.e., IC that work properly) is reduced.

However, current testing techniques do not adequately test a configurable IC. By encapsulating the configurable IC in a robust CSP that is made for testing, the configurable IC can be properly and rigorously tested to ensure that a working configurable IC is packaged in the PSiP. Furthermore, since the CSP is about the same size as the IC, the entire CSP can be packaged in the PSiP. This eliminates the need to un-package the configurable IC from the CSP before packaging the configurable IC in the PSiP.

In a PSiP, the configurable IC's might typically use cutting edge manufacturing technology (e.g., 90 nm), whereas other IC's of the PSiP might not. As such, configurable IC's are more likely to be defect prone (i.e., have defective components) than other IC's. Therefore, using the CS package for the configurable IC should reduce the number of PSiP's with defective configurable IC's.

VIII. Defect Tolerant Configurable IC

Some embodiments implement a defect tolerant configurable IC in the PSiP in conjunction with, or in lieu of, using chip scale wafer packaging to reduce the number of discarded PSiPs. A defect tolerant configurable IC as defined in this application means a configurable IC that can perform according to its design specifications even though it has a set of defectively manufactured circuit components. The set of defectively manufactured circuit components might include only one defective component, or it might include more than one defective component.

A. Overview of Configurable IC

Figure 22:
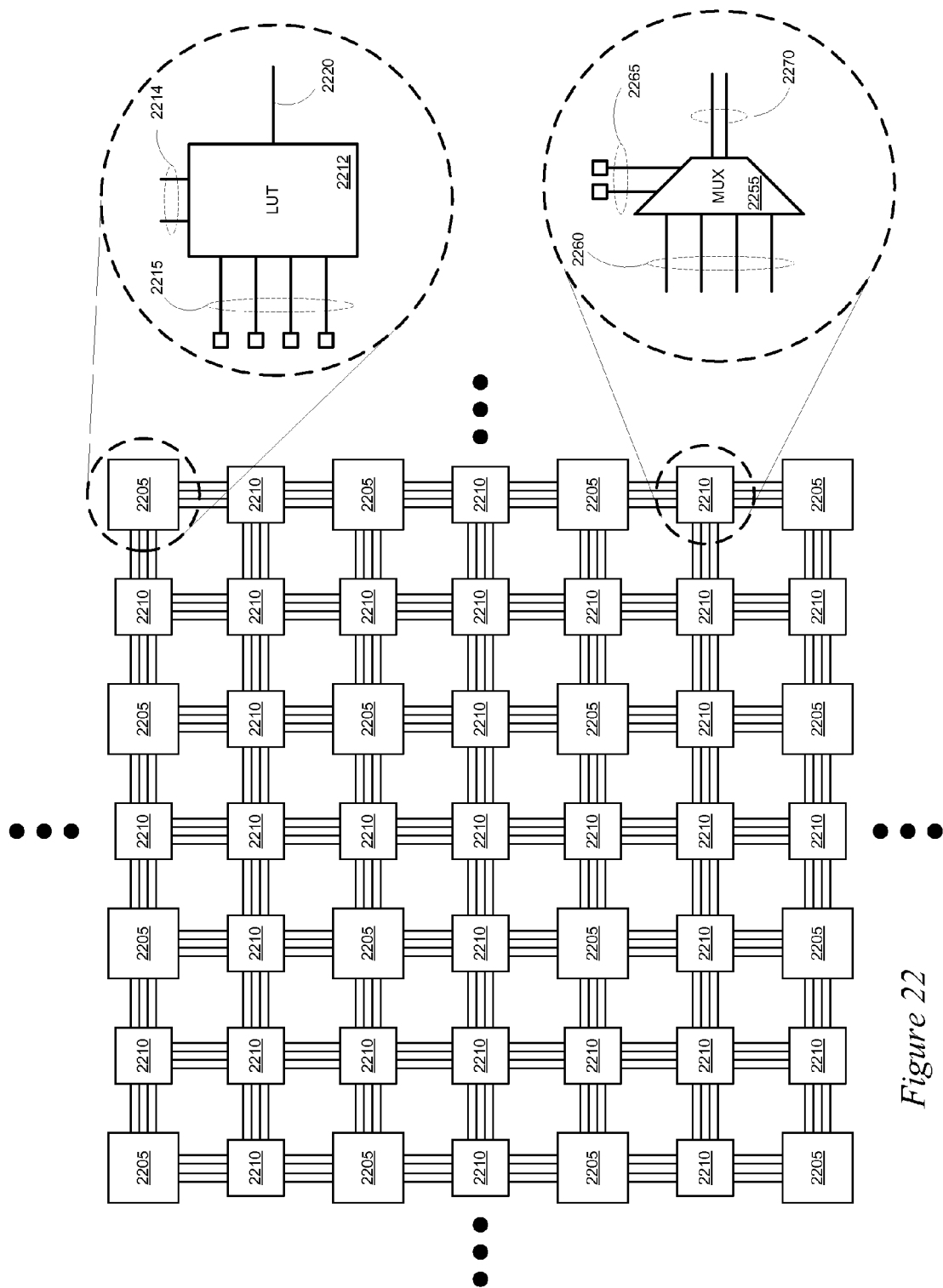
FIG. 22 illustrates a defect tolerant configurable IC.

FIG. 22 conceptually illustrates a defect tolerant configurable IC 2200. As shown in this figure, the configurable IC includes arrays of configurable logic circuits 2205 and configurable interconnect circuits 2210. A configurable circuit is a circuit that can "configurably" perform a set of operations. Specifically, a configurable circuit receives "configuration data" that specifies the operation that the configurable circuit has to perform in the set of operations that it can perform.

A configurable logic circuit is a logic circuit that can be configured to perform different functions on its input data set. FIG. 22 illustrates an example of a configurable logic circuit 2212 that can perform a set of functions. Specifically, this figure illustrates a Look Up Table ("LUT") that has a set of input terminals 2214, a set of configuration terminals 2215 and an output terminal 2220. In some embodiments, the data for the set of configuration terminals 2215 are stored in a set of storage cells (e.g., SRAM cells), which are typically located near the logic circuits. From the set of functions that a configurable logic circuit can perform, the configuration data set specifies a particular function that the configurable logic circuit has to perform on the input data set. The logic circuit is said to be configurable as the configuration data set "configures" the logic circuit to perform a particular function. In some embodiments, the configurable logic circuits are runtime reconfigurable logic circuits.

A configurable interconnect circuit is a circuit that can configurably connect an input set to an output set in a variety of manners. FIG. 22 illustrates an example of a configurable interconnect circuit 2255. As shown in this figure, the interconnect circuit 2255 is a multiplexer ("MUX"). This interconnect circuit 2255 connects a set of input terminals 2260 to a set of output terminals 2270, based on a set of configuration data that the interconnect circuit 2255 receives from a set of configuration terminals 2265. In other words, the configuration terminals 2265 carry configuration data from a set of storage cells (e.g., SRAM cells) that specify how the interconnect circuit 2255 should connect the input terminal set 2260 to the output terminal set 2270. The interconnect circuit 2255 is said to be configurable as the configuration data set "configures" the interconnect circuit 2255 to use a particular connection scheme that connects the input terminal set 2260 to the output terminal set 2270 in a desired manner. In some embodiments, the configurable interconnect circuits are runtime reconfigurable interconnect circuits (i.e., circuits that can change their configurations while the IC is operating).

Also, one of ordinary skill will realize that the configurable IC of some embodiments might not have both configurable logic circuits and configurable interconnect circuits. Some embodiments might have configurable logic circuits and non-configurable interconnect circuits, while other embodiments have configurable interconnect circuits and non-configurable logic circuits. Furthermore, in some embodiments, the configurable circuits (e.g., logic, interconnect) are reconfigurable. In some embodiments these reconfigurable circuits are sub-cycle reconfigurable.

B. Design and Manufacture of Defect Tolerant Configurable IC

In some embodiments, the configuration data is generated outside of the configurable IC. In these embodiments, a set of software tools typically converts a high-level IC design (e.g., a circuit representation or a hardware description language design) into a set of configuration data that can configure the configurable IC (or more accurately, the configurable IC's configurable circuits) to implement the IC design.

In some embodiments, the design of a configurable IC layout includes a synthesis operation, which develops a circuit representation of the configurable IC based on a logical representation of the configurable IC. After the circuit representation of the configurable IC is developed, placement and routing operations are performed. During the placement operation, each particular function of the circuit representation of the configurable IC is assigned to a particular logic circuit of the configurable IC. After the placement operation, a routing operation is performed which assigns particular connection schemes to particular interconnect circuits in order to achieve the necessary connections between the configured logic circuits to implement the circuit design as specified by the synthesis operation. Once the placement and routing operations have been performed, an IC design layout is produced.

Figure 23:
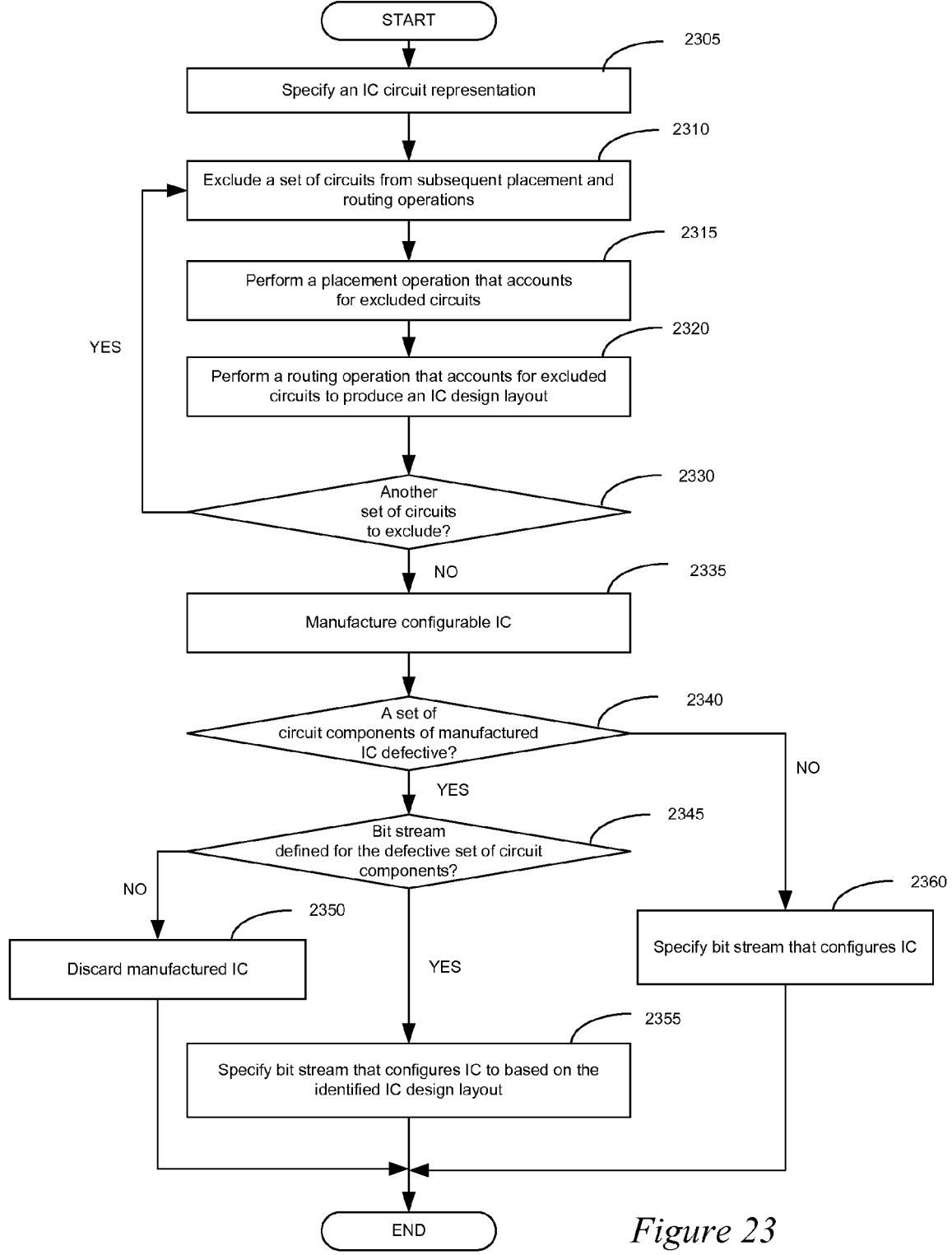
FIG. 23 illustrates a process for designing and manufacturing a defect tolerant configurable IC.

FIG. 23 conceptually illustrates a process 2300 for designing, manufacturing, and configuring the defect tolerant configurable IC of some embodiments. As shown in this figure, the process specifies an IC circuit representation. As mentioned above, the IC circuit representation is a representation of the functions of the configurable IC.

Figure 24:
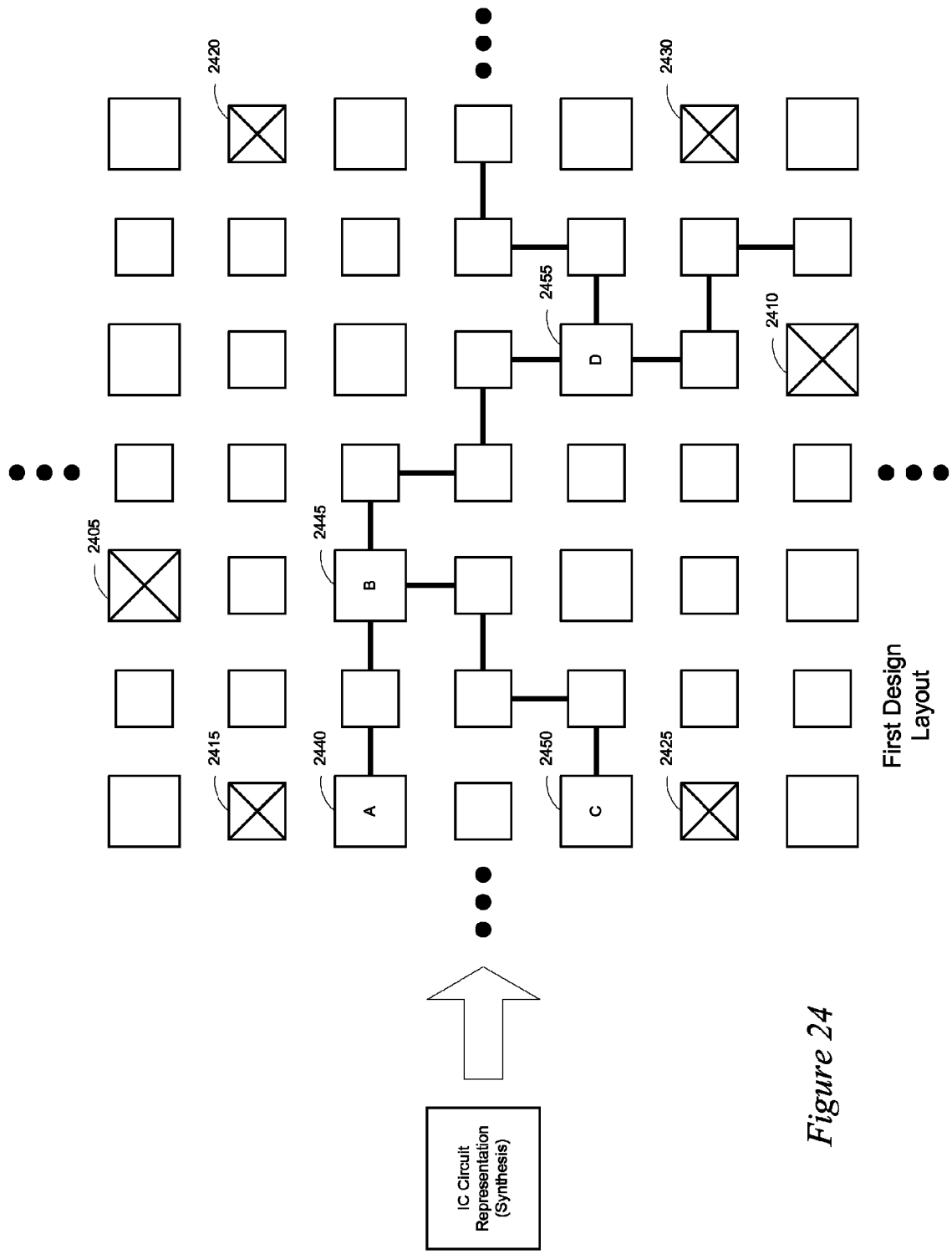
FIG. 24 illustrates a first design layout for a defect tolerant configurable IC.

As shown in FIG. 23, the process 2300 excludes (at 2310) a set of circuit components from subsequent placement and/or routing operations. FIG. 24 illustrates a configurable IC layout after a set of circuits are excluded from subsequent placement and/or routing operations. In this figure, the set of circuits that are excluded are crossed out. In this instance, two logic circuits 2405-2410 and four interconnect logic circuits 2415-2430 are excluded.

Next, the process 2300 performs (at 2315) a placement operation on the configurable IC. As mentioned above, the placement operation entails assigning functions of (i.e., defining configuration data sets for) circuits in the circuit representation (specified at 2305) to logic circuits that have not been excluded from the design layout. As shown in FIG. 24, the logic circuits 2440-2455 are assigned the functions A, B, C and D, respectively.

After the placement operation (at 2315), the process 2300 performs (at 2320) a routing operation. The routing operation assigns particular connection schemes to (i.e., defines configuration data sets for) particular interconnect circuits in order to achieve the necessary connections between the configured logic circuits to implement the circuit design as specified by the synthesis operation. After the placement and routing operations, one particular configuration bit stream (i.e., one configurable IC design layout) is defined for one possible implementation of the IC design by the configurable IC.

Figure 25:
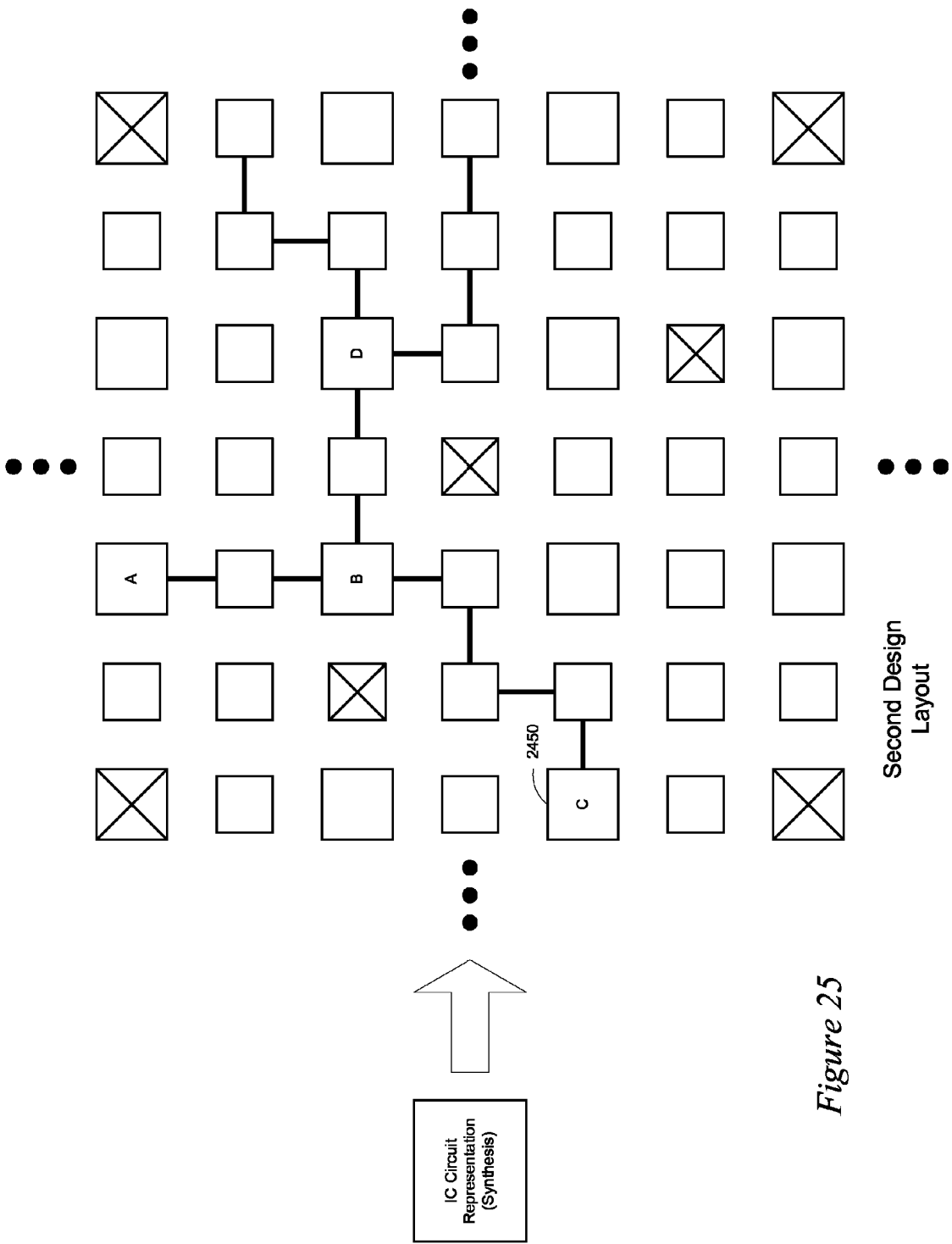
FIG. 25 illustrates a second design layout for a defect tolerant configurable IC.
Figure 26:
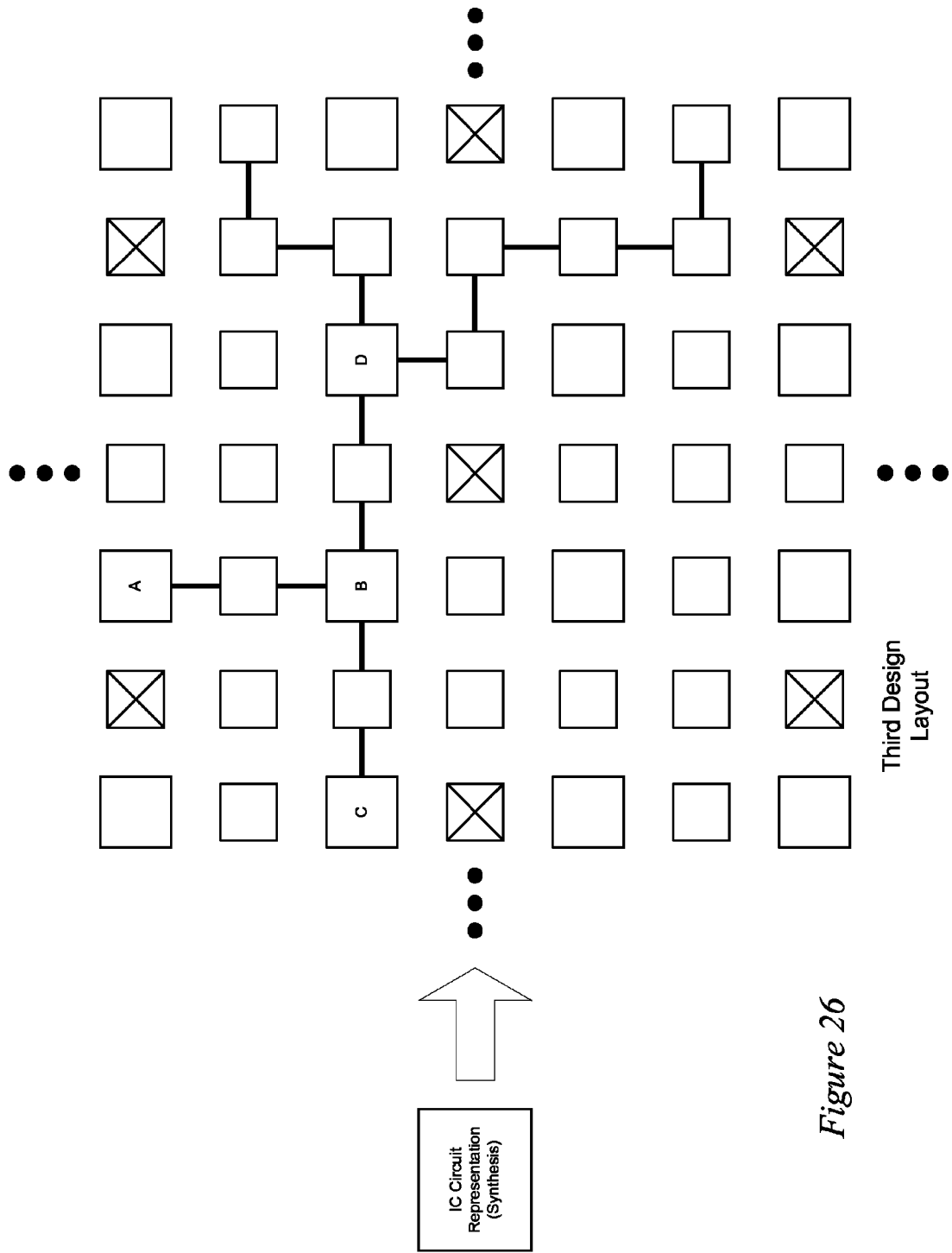
FIG. 26 illustrates a third design layout for a defect tolerant configurable IC.

Next, the process 2300 determines (at 2330) whether it should generate additional design layouts (i.e., additional configuration bit streams) for other possible implementations of the IC design by the configurable IC. If so, the process 2300 returns to 2310 to exclude another set of circuits, and performs placement and routing operations to produce another IC design layout that has the functionality of the IC circuit representation specified at 2305. FIGS. 25 and 26 illustrate configurable IC layouts after two different sets of circuits are excluded from subsequent placement and/or routing operations. In these figures, the sets of circuits that are excluded are crossed out.

In some embodiments, several iterations of the placement and routing operations are performed to produce several IC design layouts that all have the same operations (e.g., functionalities, connections). The produced IC design layouts will vary according to the circuit components that are excluded during each iteration of the placement and routing operations. For instance, FIGS. 24-26 illustrate three different implementations of (i.e., design layouts for) a circuit that in a user design, has four functions A-D. However, different IC design layouts may include circuits that are assigned the same operation in some cases. For example, the circuit 2450 is assigned the same function C in both the first and second IC design layouts illustrated in FIGS. 24 and 25.

Once the set of IC design layouts have been defined, the process 2300 manufactures (at 2335) the configurable IC. Next, the process 2300 determines (at 2340) whether one or more of the circuit components of the manufactured IC is defective. Some embodiments make this determination by performing one or more series of tests on the manufactured configurable IC. In some embodiments, these series of tests include determining whether the IC performs it operational characteristics by using probes coupled to external testing circuitry (e.g., VLSI tester). This testing circuitry determines whether the output(s) of the circuit are the same as known correct output(s) for the IC. Moreover, some embodiments have a built-in self tester ("BIST"). In such instances, components of the configurable IC are configured to test each other. For example, one half of the configurable IC would test the other half of the configurable IC, and vice versa.

If no circuit component of the manufactured IC is defective, the process 2300 specifies (at 2360) a bitstream-identifying parameter in the configurable IC that identifies one of the configuration bit streams (that were defined at 2315 and 2320) as the configuration bit stream to use for the configurable IC. On the other hand, if a set of circuit components of the manufactured IC is defective, the process 2300 determines (at 2345) whether a configuration bit stream was defined at 2315 and 2320 for a configurable IC with the identified set of defective circuit components. If not, the process discards (at 2350) the configurable IC. Otherwise, at 2355, the process 2300 specifies the bitstream-identifying parameter in the configurable IC to identify the configuration bit stream that was defined for the identified set of defective circuit components.

In some embodiments, the configurable IC is accompanied by a non-volatile memory (e.g., flash memory) that stores all the various configuration bit streams that were defined for the configurable IC at 2315 and 2320. At run time, the parameter that is specified in the configurable IC is used to identify the configuration bit stream that is stored in the non-volatile memory. This identified configuration bit stream can then be retrieved and loaded into the configurable IC to configure the IC so that it can implement the desired circuit design.

Figure 27:
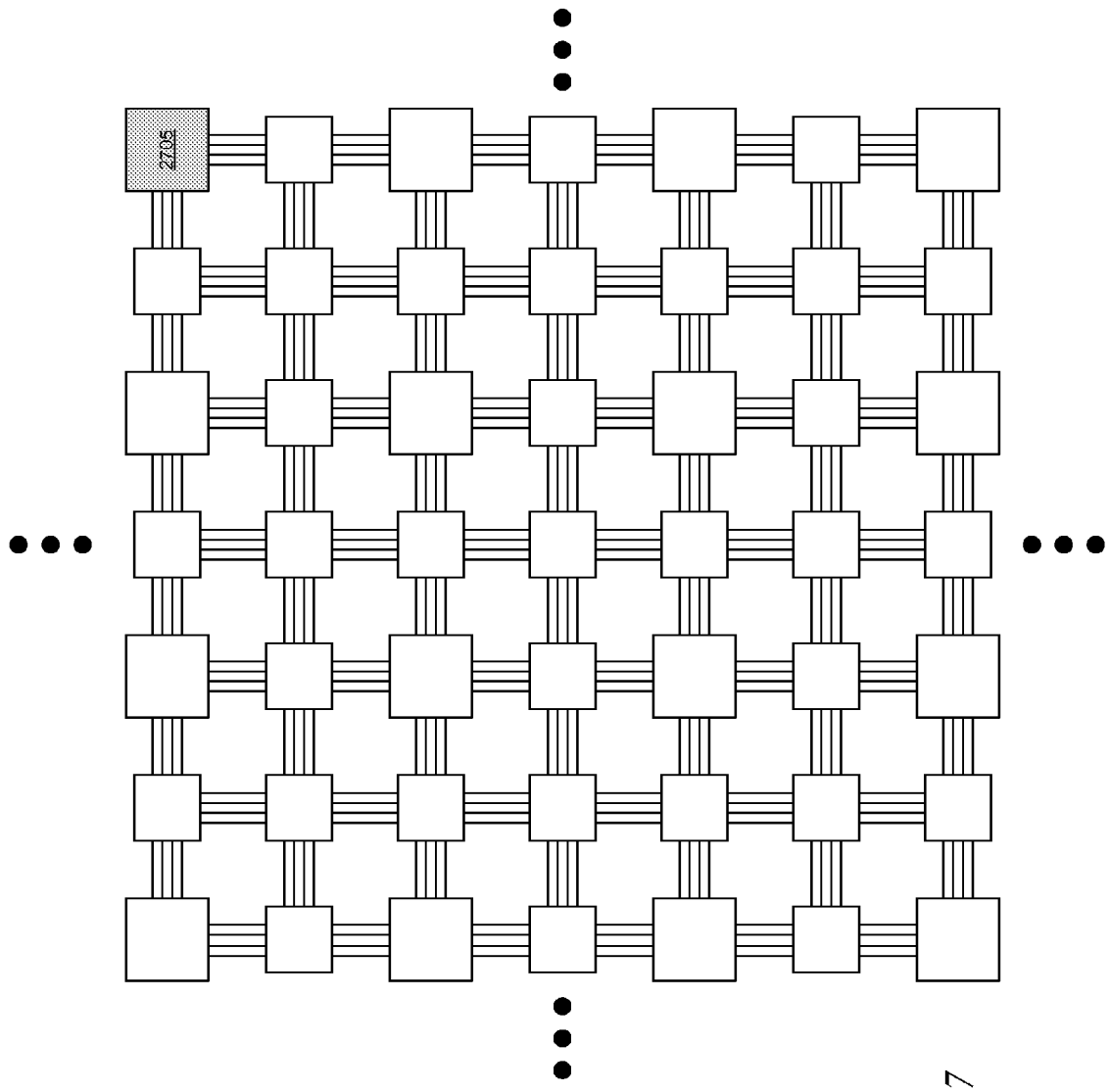
FIG. 27 illustrates a defect tolerant configurable IC with a defective circuit component.
Figure 28:
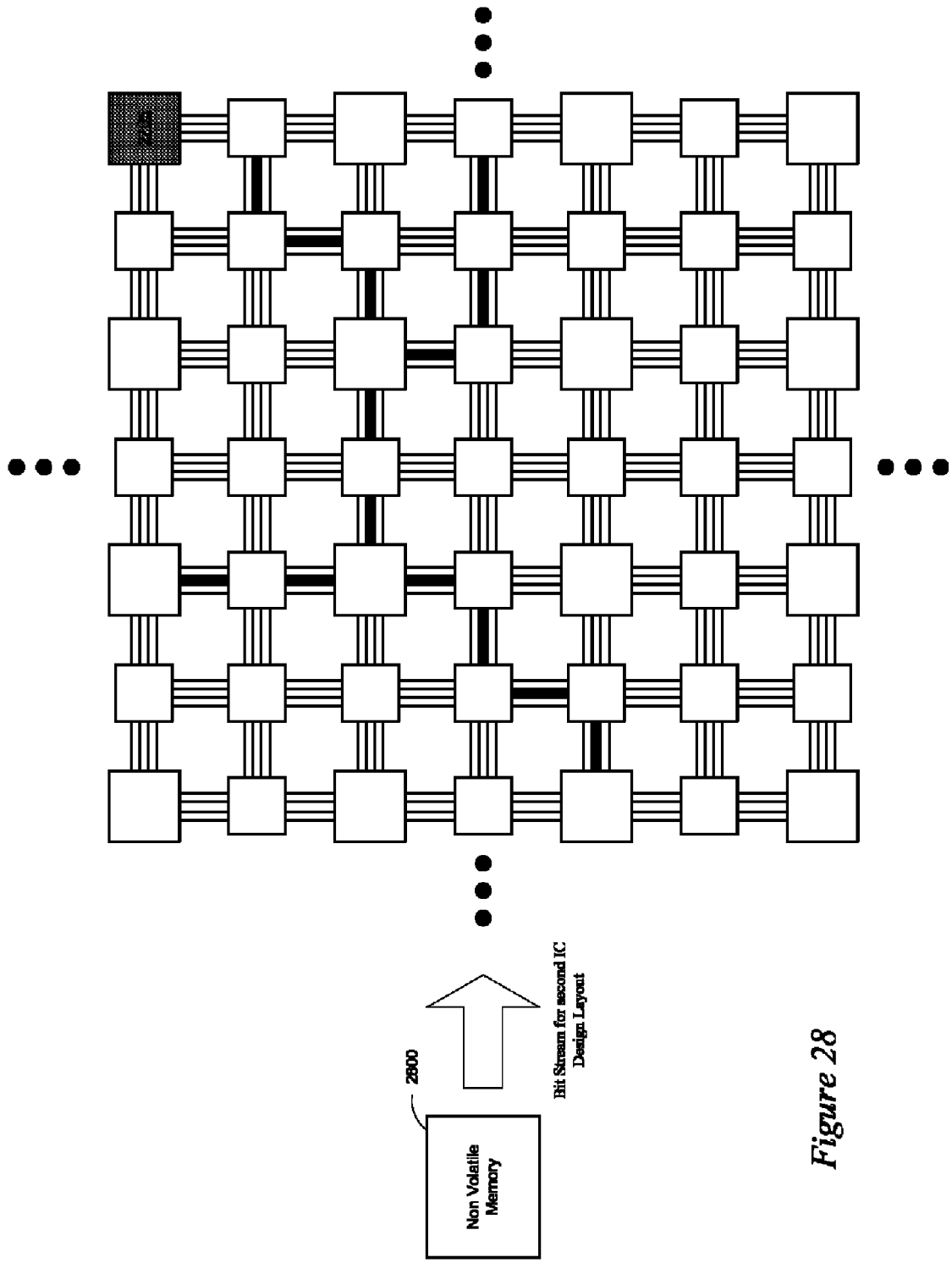
FIG. 28 illustrates a defect tolerant configurable IC with a specified bit stream.

FIG. 27 conceptually illustrates a manufactured IC with a defective circuit component. As shown in this figure, the defective circuit component is indicated by the shaded circuit component 2705. Thus, in some embodiments, the process 2300 identifies (at 2350) the second IC design layout (as shown in FIG. 25), since this particular IC design layout excludes the defective circuit component 2705. FIG. 28 illustrates a configurable IC loading from a non-volatile memory 2800 a specified configuration bit stream, which, in some embodiments, is specified by the bitstream-identifying parameter of the configurable IC.

The process 2300 can be used to design, manufacture, and configure a configurable IC that can withstand a certain amount of manufacturing defects. The configurable IC can be defect tolerant because the process specifies multiple configuration bit streams for it based on multiple different possible defect patterns on the configurable IC. After manufacturing, the configurable IC's defects are identified, and if those defects fall within one of the defect patterns, the configurable IC is assigned a parameter that at runtime identifies the configuration bit stream that is associated with the particular defect pattern.

The architecture illustrated in FIGS. 22 and 24-26 are simplified conceptual presentations of a configurable IC. One of ordinary skill will realize that the configurable logic and interconnect circuits of other embodiments might be arranged differently. For instance, U.S. patent application Ser. No. 11/082,193, filed on Mar. 15, 2005, now issued as U.S. Pat. No. 7,295,037, discloses in more detail the architecture of the configurable IC of some embodiments of the invention.

The defect tolerant configurable IC that is produced by using the process 2300 is housed in a PSiP in some embodiments. For instance, any of the configurable IC's of the PSiP's illustrated in FIGS. 1, 2, 3, 4, 6-9, and 18-21 might be a defect tolerant configurable IC that is produced by using the process 2300.

Figure 29:
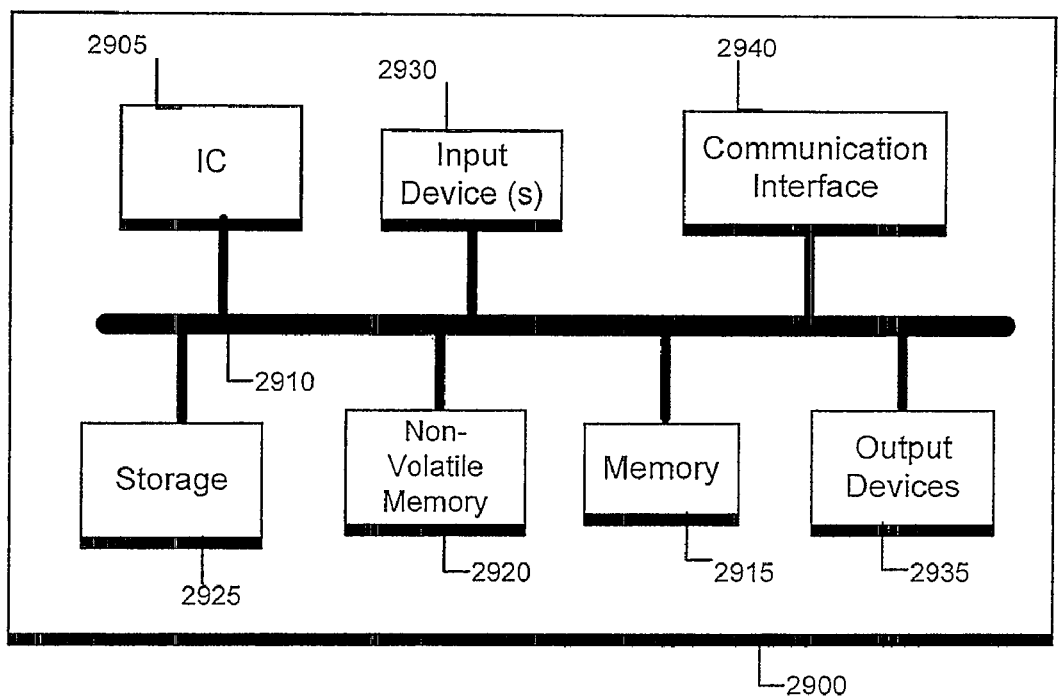
FIG. 29 illustrates an electronic system.

Alternatively, the defect tolerant configurable IC might be individually packaged in its own package and then incorporated into an electronic system using conventional system integration techniques. FIG. 29 conceptually illustrates an example of such an electronics system 2900 that has a defect tolerant configurable IC 2905 of some embodiments.

The system 2900 can be a stand-alone computing or communication device, or it can be part of another electronic device. As shown in FIG. 29, the system 2900 not only includes the IC 2905, but also includes a bus 2910, a system memory 2915, a non-volatile memory 2920, a storage device 2925, input devices 2930, output devices 2935, and communication interface 2940. In some embodiments, the non-volatile memory 2920 stores configuration data and re-loads it at power-up. Although the non-volatile memory 2920 is shown outside of the IC 2905, in some embodiments, the non-volatile memory is either on the same die or the same package as the IC 2905.

The bus 2910 collectively represents all system, peripheral, and chipset interconnects (including bus and non-bus interconnect structures) that communicatively connect the numerous internal devices of the system 2900. For instance, the bus 2910 communicatively connects the IC 2905 with the non-volatile memory 2920, the system memory 2915, and the permanent storage device 2925.

From these various memory units, the IC 2905 receives data for processing and configuration data for configuring the IC's configurable logic and/or interconnect circuits. When the IC 2905 has a processor, the IC also retrieves from the various memory units instructions to execute. The non-volatile memory 2920 stores static data and instructions that are needed by the IC 2905 and other modules of the system 2900. The storage device 2925, on the other hand, is a read-and-write memory device. This device is a non-volatile memory unit that stores instructions and/or data even when the system 2900 is off. Like the storage device 2925, the system memory 2915 is a read-and-write memory device. However, unlike the storage device 2925, the system memory is a volatile read-and-write memory, such as a random access memory. The system memory stores some of the instructions and/or data that the IC needs at runtime.

The bus 2910 also connects to the input and output devices 2930 and 2935. The input devices enable the user to enter information into the system 2900. The input devices 2930 can include touch-sensitive screens, keys, buttons, keyboards, cursor-controllers, microphone, etc. The output devices 2935 display the output of the system 2900.

Finally, as shown in FIG. 29, bus 2910 also couples system 2900 to other devices through a communication interface 2940. Examples of the communication interface include network adapters that connect to a network of computers, or wired or wireless transceivers for communicating with other devices. One of ordinary skill in the art would appreciate that any other system configuration may also be used in conjunction with the invention, and these system configurations might have fewer or additional components.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

What is claimed is:

1. A system in package ("SiP") comprising:
a plurality of integrated circuits ("ICs"), said plurality of ICs comprising:
a first IC comprising a plurality of configurable circuits and a set of volatile memories associated with each configurable circuit, each configurable circuit for configurably performing different operations based on different configuration data; and
a second IC comprising at least one non-volatile memory for storing configuration data for the first IC, wherein the first IC loads the configuration data, during an initial power-up cycle of the first IC, from the non-volatile memory of the second IC into the volatile memories associated with a set of the configurable circuits of the first IC to configure the configurable circuits in the set to perform a set of configurable operations based on the loaded configuration data once the first IC has started its runtime operations after the initial power-up cycle.

2. The SiP of claim 1, wherein the second IC is on a separate die from the first IC.

3. The SiP of claim 1, wherein at least one configurable circuit is a configurable logic circuit for configurably performing a set of operations based on a set of configuration data.

4. The SiP of claim 3, wherein the configurable logic circuit is a Look Up Table ("LUT").

5. The SiP of claim 1, wherein at least one configurable circuit is a configurable interconnect circuit for configurably connecting a set of inputs to a set of outputs based on a set of configuration data.

6. The SiP of claim 5, wherein the configurable interconnect circuit is a multiplexer ("MUX").

7. The SiP of claim 1 further comprising:
a substrate on top of which the first and second ICs are mounted; and
a cap for encapsulating a top side of the substrate to form a housing that houses the first and second ICs.

8. The SiP of claim 7, wherein the first and second ICs are positioned on the substrate, wherein the first IC is positioned side by side with the second IC.

9. The SiP of claim 7, wherein the second IC is directly mounted on the substrate, and the first IC is mounted on top of the second IC.

10. The SiP of claim 7 further comprising a flip chip package.

11. The SiP of claim 1, wherein the first IC is manufactured by a first manufacturing process and the second IC is manufactured by a second manufacturing process that is different than the first manufacturing process.

12. The SiP of claim 1, wherein at least one configurable circuit is a reconfigurable circuit.

13. The SiP of claim 12, wherein the reconfigurable circuit is for reconfigurably performing different operations based on different configuration data during a runtime of the first IC.

14. The SiP of claim 1, wherein the non-volatile memory is a flash memory.

15. The SiP of claim 7, wherein one of the first IC and the second IC is farther from the substrate than the other of the first IC and the second IC.

16. The SiP of claim 1, wherein the first IC is a reconfigurable IC and at least one configurable circuit in the first IC is a reconfigurable circuit, wherein the volatile memories of a particular reconfigurable circuit in the first IC comprises a plurality of volatile memory cells, wherein each of the memory cells stores different configuration data for configuring the particular reconfigurable circuit to perform a different operation during a different reconfiguration cycle of the first IC.

17. The SiP of claim 16, wherein the volatile memory cells are static random-access memory (SRAM) cells.

18. A system in package ("SiP") comprising:
a plurality of integrated circuit ("IC") dies, said plurality of IC dies comprising:
a first die comprising at least one non-volatile memory for storing configuration data; and
a second die comprising a plurality of configurable circuits and a set of volatile memories associated with each configurable circuit, each configurable circuit for configurably performing a set of configurable operations based on different configuration data that is loaded from the non-volatile memory of the first die during an initial power-up cycle of the second die and stored in the volatile memories associated with the configurable circuit, wherein the set of configurable operations is performed once the second die has started its runtime operations after the initial power-up cycle.

19. The SiP of claim 18, wherein at least one configurable circuit is a reconfigurable circuit, wherein the reconfigurable circuit is for reconfigurably performing different operations based on different configuration data during a runtime of the first IC.

20. The SiP of claim 19 further comprising:

a substrate on top of which the first and second dies are mounted; and a cap for encapsulating a top side of the substrate to form a housing that houses the first and second dies.

21. The SiP of claim 18, wherein said configuration data comprises a plurality of sets of configuration data.

22. A method for creating a System in Package ("SiP"), the method comprising:

mounting, on a substrate, a first integrated circuit ("IC") comprising a plurality of configurable circuits and a volatile memory associated with each configurable circuit, each configurable circuit for configurably performing different operations based on different configuration data;

mounting, on the substrate, a second IC comprising at least one non-volatile memory for storing configuration data for the first IC; and storing the configuration data for the first IC in the non-volatile memory of said second IC for subsequent loading, during an initial power-up cycle of the first IC, into the volatile memory associated with a set of configurable circuits of the first IC to configure the set of configurable circuits to perform a set of configurable operations based on the loaded configuration data once the first IC has started its runtime operations after the initial power-up cycle.

23. The method of claim 22, wherein said loading comprises identifying a subset of the configuration data stored in the second IC using a parameter of the first IC.

* * * * *